United States Patent
Kerr et al.

(10) Patent No.: US 7,915,706 B1
(45) Date of Patent: Mar. 29, 2011

(54) LINEARITY IMPROVEMENTS OF SEMICONDUCTOR SUBSTRATE USING PASSIVATION

(75) Inventors: Daniel Charles Kerr, Oak Ridge, NC (US); Thomas Gregory McKay, Boulder Creek, CA (US); Michael Carroll, Jamestown, NC (US); Joseph M. Gering, Stokesdale, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 12/169,244

(22) Filed: Jul. 8, 2008

Related U.S. Application Data

(60) Provisional application No. 60/948,597, filed on Jul. 9, 2007.

(51) Int. Cl.
*H01L 27/06* (2006.01)
(52) U.S. Cl. ................. 257/528; 257/E27.014
(58) Field of Classification Search ........... 257/528, 257/531, E27.014, E27.016, E27.017; 438/238
See application file for complete search history.

(56) References Cited

U.S. PATENT DOCUMENTS 5,578,860 A * 11/1996 Costa et al. ............ 257/528
6,265,248 B1 * 7/2001 Darmawan et al. ...... 438/155

OTHER PUBLICATIONS

Matsushita, Takeshi et al. "Highly Reliable High-Viltage Transistors by Use of the SIPOS Process". IEEE Transactions on Electron Devices. vol. ED-23 (8). p. 826-830.*
Aspar, B. et al., "IC's Performance Improvement and 3D Integration by Layer Transfer Technologies," 2006 IEEE International SOI Conference Proceedings, 2006, pp. 8-12, IEEE.
Gamble, H. S. et al., "Low-Loss CPW Lines on Surface Stabilized High-Resistivity Silicon," IEEE Microwave and Guided Wave Letters, Oct. 1999, pp. 395-397, vol. 9, No. 10, IEEE.
Hirae, S. et al., "Energy Distribution of Trapping States in Polycrystalline Silicon," J. Appl. Phys., Feb. 1980, pp. 1043-1047, vol. 51, No. 2, American Institute of Physics.
Lederer, D. et al., "Enhanced High Resistivity SOI Wafers for RF Applications," 2004 IEEE International SOI Conference, Oct. 2004, pp. 46-47, IEEE.
Lederer, D. et al., "New Substrate Passivation Method Dedicated to HR SOI Wafer Fabrication with Increased Substrate Resistivity," IEEE Electron Device Letters, Nov. 2005, pp. 805-807, vol. 26, No. 11, IEEE.
Wu, Y. et al., "The Effect of a SiO2 Interface Layer on CPW Lines and Schottky Barrier Diodes on HRS Substrates," Silicon Monolithic Integrated Circuits in RF Systems, 1998, pp. 178-180, British Crown Copyrights.
Wu, Yunhong et al., "SiO2 Interface Layer Effects on Microwave Loss of High-Resistivity CPW Line," IEEE Microwave and Guided Wave Letters, Jan. 1999, pp. 10-12, vol. 9, No, 1, IEEE.

* cited by examiner

*Primary Examiner* — Matthew S Smith
*Assistant Examiner* — Daniel Shook
(74) *Attorney, Agent, or Firm* — Withrow & Terranova, P.L.L.C.

(57) ABSTRACT

The present invention relates to using a potentially trap-rich layer, such as a polycrystalline Silicon layer, over a passivation region of a semiconductor substrate or a Silicon-on-insulator (SOI) device layer to substantially immobilize a surface conduction layer at the surface of the semiconductor substrate or SOI device layer at radio frequency (RF) frequencies. The potentially trap-rich layer may have a high density of traps that trap carriers from the surface conduction layer. The average release time from the traps may be longer than the period of any present RF signals, thereby effectively immobilizing the surface conduction layer, which may substantially prevent capacitance and inductance changes due to the RF signals. Therefore, harmonic distortion of the RF signals may be significantly reduced or eliminated. The semiconductor substrate may be a Silicon substrate, a Gallium Arsenide substrate, or another substrate.

18 Claims, 28 Drawing Sheets

LINEARITY IMPROVEMENTS OF SEMICONDUCTOR SUBSTRATE USING PASSIVATION

This application claims the benefit of provisional patent application Ser. No. 60/948,597 filed Jul. 9, 2007, the disclosure of which is hereby incorporated herein by reference in its entirety.

FIELD OF THE INVENTION

Embodiments of the present invention relate to semiconductor substrates used to manufacture semiconductor devices, which may be used in radio frequency (RF) communications systems.

BACKGROUND OF THE INVENTION

Silicon substrates are widely used in the manufacture of semiconductor devices. Low cost and highly evolved manufacturing techniques make Silicon a preferred material in many applications, when compared with other semiconductor materials. Standard complementary metal oxide semiconductor (CMOS) process techniques are often used with Silicon and are highly evolved and cost effective. High resistivity Silicon substrates may be used in radio frequency (RF) devices. If the period of an RF signal is shorter than a majority carrier relaxation time, then the majority carriers in a Silicon substrate may not respond to the RF signal. The majority carriers may appear to be frozen and the Silicon substrate may behave as a dielectric. However, Silicon has certain characteristics that may produce undesirable behavior in some RF applications.

For example, the doping level in high resistivity Silicon is very low or non-existent; therefore, oxide charges at the surface of a Silicon substrate, or a weak electric field in the Silicon substrate, can induce an inversion or accumulation layer, which may function as a surface conduction layer at the surface of the Silicon substrate. RF signals traversing above the surface of the Silicon substrate may modulate the surface conduction layer, which may cause non-linear capacitance, non-linear conductance, or both affecting RF interactions between the Silicon substrate and other layers. The non-linear characteristics may introduce harmonic distortion in the RF signals, which may exceed allowable limits.

One technique for reducing the impact of the non-linear characteristics is to incorporate a conductive shielding layer between the surface of the Silicon substrate and other layers handling RF signals; however, the conductive shielding layer may increase complexity and signal loss. Thus, there is a need to reduce, or eliminate, non-linear characteristics associated with a surface conduction layer without using a conductive shielding layer using standard CMOS process techniques.

SUMMARY OF THE EMBODIMENTS

The present invention relates to using a potentially trap-rich layer, such as a polycrystalline Silicon layer, over a passivation region of a semiconductor substrate or a Silicon-on-insulator (SOI) device layer to substantially immobilize a surface conduction layer at the surface of the semiconductor substrate or SOI device layer at radio frequency (RF) frequencies. The potentially trap-rich layer may have a high density of traps that trap carriers from the surface conduction layer. The average release time from the traps may be longer than the period of any present RF signals, thereby effectively immobilizing the surface conduction layer, which may substantially prevent capacitance and inductance changes due to the RF signals. Therefore, harmonic distortion of the RF signals may be significantly reduced or eliminated. The semiconductor substrate may be a Silicon substrate, a Gallium Arsenide substrate, or another substrate.

The semiconductor substrate or SOI device layer is divided into one or more passivation regions and one or more non-passivation regions. In the passivation regions, the potentially trap-rich layer is used to immobilize the surface conduction layer. In the non-passivation regions, the potentially trap-rich layer may be used to form one or more active devices, such as metal oxide semiconductor (MOS) transistor elements. In the non-passivation regions, the potentially trap-rich layer may be doped, may be insulated from the semiconductor substrate or SOI device layer, may be used to form gates of the MOS transistor elements, or any combination thereof. Standard complementary metal oxide semiconductor (CMOS) process techniques may be used to process each of the passivation regions and the non-passivation regions as needed.

In one embodiment of the present invention, a metallization layer may be applied directly to the potentially trap-rich layer. Other embodiments of the present invention may include one or more intervening layers between the potentially trap-rich layer and the metallization layer. The metallization layer may be used to form an RF transmission line, an RF inductive element, an RF coupler, a micro-electromechanical systems (MEMS) RF device, such as a MEMS RF switch, or any combination thereof. In an alternate embodiment of the present invention, an insulator layer may be located between the potentially trap-rich layer and the metallization layer. In an additional embodiment of the present invention, the potentially trap-rich layer may be included in an SOI wafer. The SOI wafer may include the SOI device layer and the potentially trap-rich layer may be formed over the SOI device layer. The SOI wafer may include a semiconductor substrate, and an additional potentially trap-rich layer may be formed over the semiconductor substrate to passivate all or part of the semiconductor substrate. The semiconductor substrate may be a Silicon substrate, a Gallium Arsenide substrate, or another substrate.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 1 through 27 may not be drawn to scale.

DETAILED DESCRIPTION OF THE PREFERRED EMBODIMENTS

Figure 1:
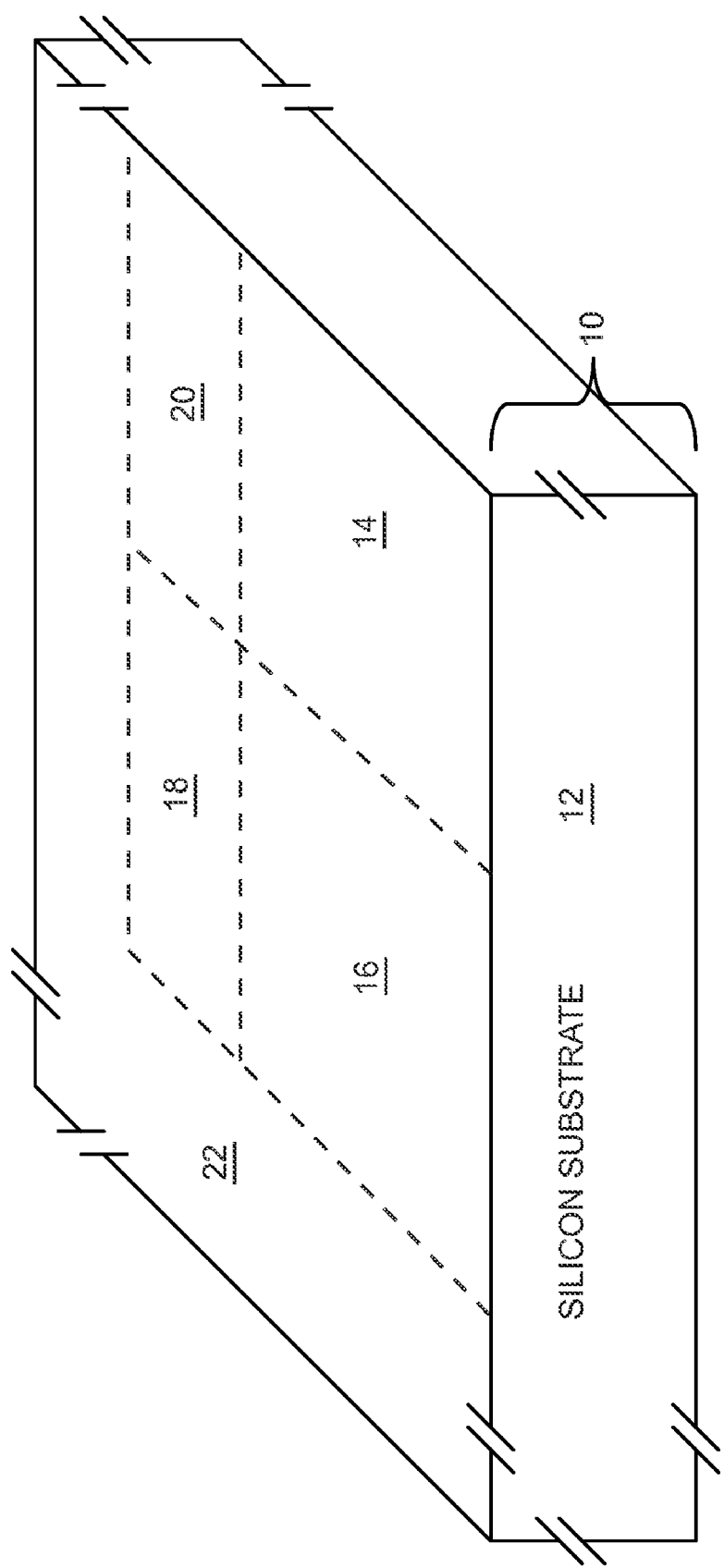
FIG. 1 shows a three-dimensional view of a first semiconductor wafer, according to one embodiment of the present invention.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to using a potentially trap-rich layer, such as a polycrystalline Silicon layer, over a passivation region of a semiconductor substrate or a Silicon-on-insulator (SOI) device layer to substantially immobilize a surface conduction layer at the surface of the semiconductor substrate or SOI device layer at radio frequency (RF) frequencies. The potentially trap-rich layer may have a high density of traps that trap carriers from the surface conduction layer. The average release time from the traps may be longer than the period of any present RF signals, thereby effectively immobilizing the surface conduction layer, which may substantially prevent capacitance and inductance changes due to the RF signals. Therefore, harmonic distortion of the RF signals may be significantly reduced or eliminated. The semiconductor substrate may be a Silicon substrate, a Gallium Arsenide substrate, or another substrate. In one embodiment of the present invention, the potentially trap-rich layer is an amorphous Silicon film, which may be formed by modifying a top layer of a Silicon substrate to induce a large number of traps. Ions may be implanted to disrupt the Silicon lattice of the Silicon substrate to make it amorphous.

The semiconductor substrate or SOI device layer is divided into one or more passivation regions and one or more non-passivation regions. In the passivation regions, the potentially trap-rich layer is used to immobilize the surface conduction layer. In the non-passivation regions, the potentially trap-rich layer may be used to form one or more active devices, such as metal oxide semiconductor (MOS) transistor elements. In the non-passivation regions, the potentially trap-rich layer may be doped, may be insulated from the semiconductor substrate or SOI device layer, may be used to form gates of the MOS transistor elements, or any combination thereof. Standard complementary metal oxide semiconductor (CMOS) process techniques may be used to process each of the passivation regions and the non-passivation regions as needed.

In one embodiment of the present invention, a metallization layer may be applied directly to the potentially trap-rich layer. Other embodiments of the present invention may include one or more intervening layers between the potentially trap-rich layer and the metallization layer. The metallization layer may be used to form an RF transmission line, an RF inductive element, an RF coupler, a micro-electromechanical systems (MEMS) RF device, such as a MEMS RF switch, or any combination thereof. In an alternate embodiment of the present invention, an insulator layer may be located between the potentially trap-rich layer and the metallization layer. In an additional embodiment of the present invention, the potentially trap-rich layer may be included in an SOI wafer. The SOI wafer may include the SOI device layer and the potentially trap-rich layer may be formed over the SOI device layer. The SOI wafer may include a semiconductor substrate, and an additional potentially trap-rich layer may be formed over the semiconductor substrate to passivate all or part of the semiconductor substrate. The semiconductor substrate may be a Silicon substrate, a Gallium Arsenide substrate, or another substrate.

FIGS. 1 through 27 may not be drawn to scale. FIG. 1 shows a three-dimensional view of a first semiconductor wafer 10, according to one embodiment of the present invention. The first semiconductor wafer 10 includes a Silicon substrate 12, which has a first passivation region 14, a first non-passivation region 16, a second passivation region 18, a second non-passivation region 20, and a third non-passivation region 22. One or more active devices may be formed over the first, second, and third non-passivation regions 16, 20, 22, and one or more passive devices may be formed over the first and second passivation regions 14, 18. Other embodiments of the present invention may have any number of passivation regions providing any number of passive devices, active devices, or both, and any number of non-passivation regions providing any number of passive devices, active devices, or both. Other embodiments of the present invention may use another semiconductor substrate in place of the Silicon substrate 12, such as Gallium Arsenide. According to one embodiment of the present invention, the first and second passivation regions 14, 18 of the Silicon substrate 12 are protected from silicide formation during processing of the first semiconductor wafer 10. Silicides are metal/Silicon compounds formed from metal deposition on the surface of the Silicon substrate 12. The deposited metal is then sintered with the Silicon during subsequent processing of the first semiconductor wafer 10.

Figure 2:
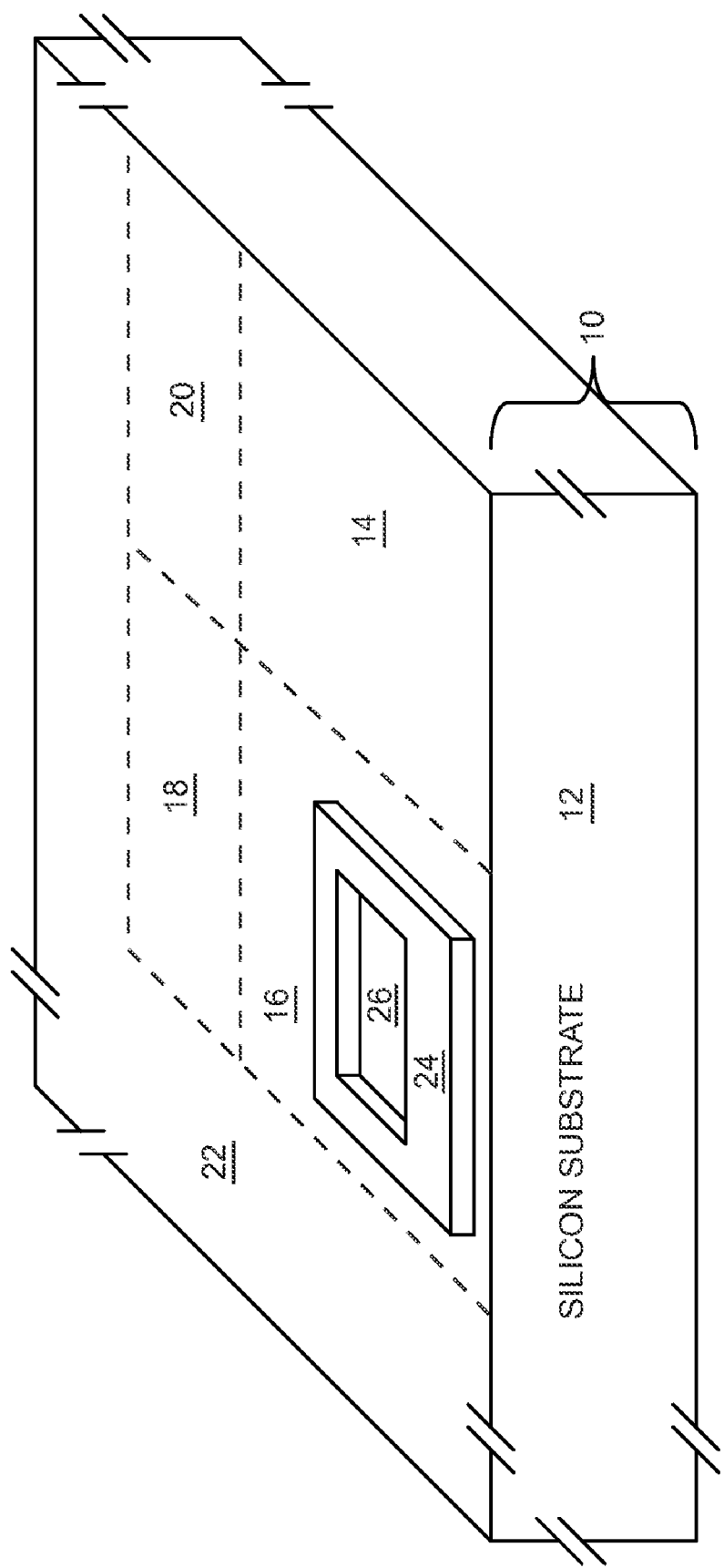
FIG. 2 shows isolation oxide and a well added to the first semiconductor wafer illustrated in FIG. 1.

FIG. 2 shows isolation oxide 24 and a well 26 added to the first semiconductor wafer 10 illustrated in FIG. 1. The isolation oxide 24 may surround the well 26. Standard CMOS process techniques may be used to add the isolation oxide 24 and the well 26. Standard CMOS process techniques may include layer formation, such as application, growth, deposition, and oxidation; doping, such as implanting; masking, such as photo layer application and patterning; and removal, such as wet etching, dry etching, and lift-off. The well 26 may be P-well or an N-well. Other embodiments of the present invention may include any number of N-wells, any number of P-wells, additional isolation oxide 24, or any combination thereof.

Figure 3:
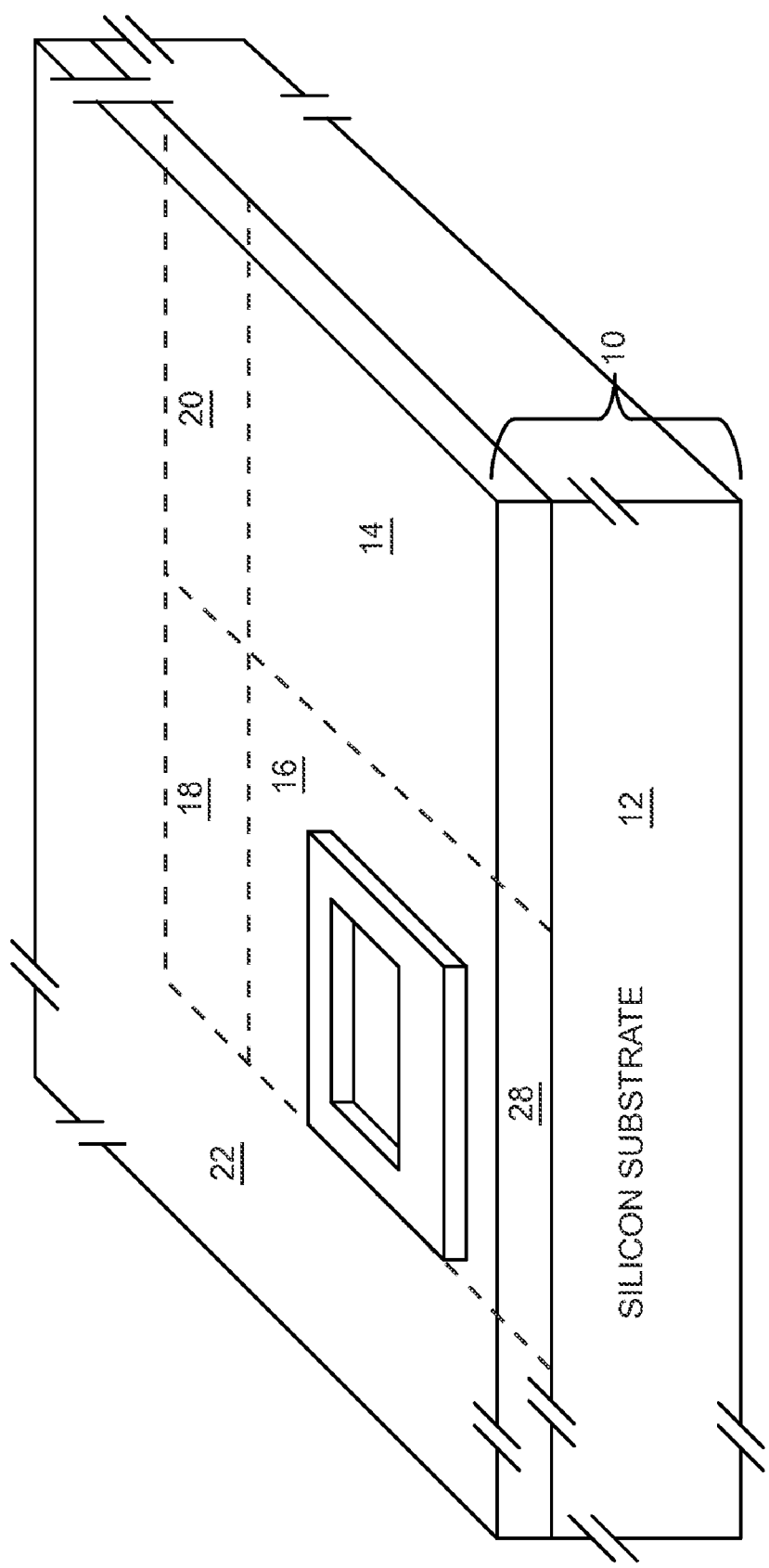
FIG. 3 shows a gate oxide layer added to the first semiconductor wafer illustrated in FIG. 2.

FIG. 3 shows a gate oxide layer 28 added to the first semiconductor wafer 10 illustrated in FIG. 2. The gate oxide layer 28 may be formed over the first, second, and third non-passivation regions 16, 20, 22, over the first and second passivation regions 14, 18, over the isolation oxide 24, over the well 26, or any combination thereof. Standard CMOS process techniques may be used to form the gate oxide layer 28.

Figure 4:
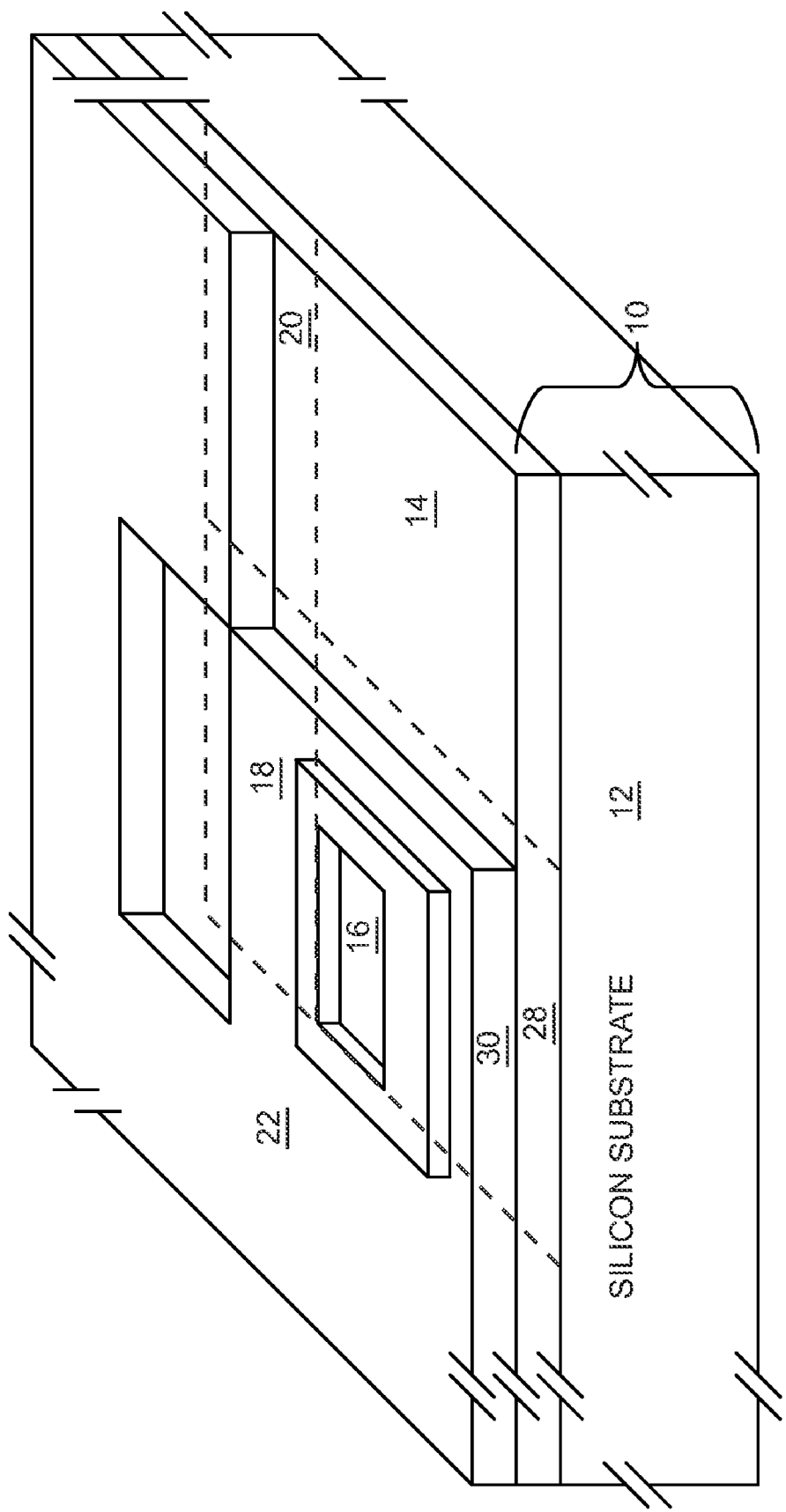
FIG. 4 shows a first patterned photo layer added to the first semiconductor wafer illustrated in FIG. 3.

FIG. 4 shows a first patterned photo layer 30 added to the first semiconductor wafer 10 illustrated in FIG. 3. Standard CMOS process techniques may be used to apply and pattern the first patterned photo layer 30. The first patterned photo layer 30 masks the gate oxide layer 28 over the first, second, and third non-passivation regions 16, 20, 22, and leaves the first and second passivation regions 14, 18 unmasked. The gate oxide layer 28 over the first and second passivation regions 14, 18 is then etched using an etching process, such as a wet etch, to remove the gate oxide layer 28 over the first and second passivation regions 14, 18. The first patterned photo layer 30 is then removed. Standard CMOS process techniques may be used to etch the gate oxide layer 28 and remove the first patterned photo layer 30.

Figure 5:
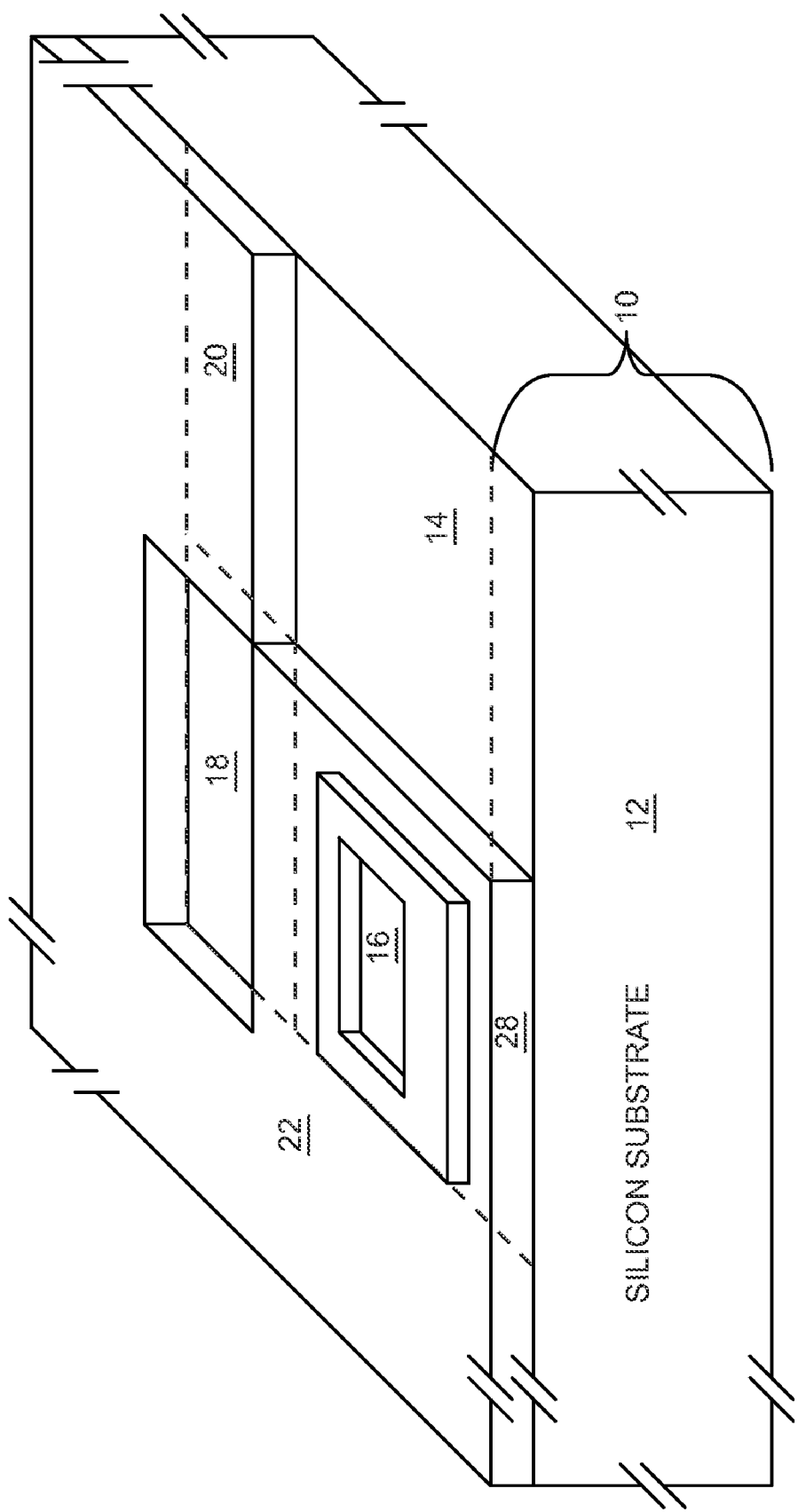
FIG. 5 shows the gate oxide layer removed from first and second passivation regions, and the first patterned photo layer removed from the first semiconductor wafer illustrated in FIG. 4.

FIG. 5 shows the gate oxide layer 28 removed from the first and second passivation regions 14, 18 and the first patterned photo layer 30 removed from the first semiconductor wafer 10 illustrated in FIG. 4. Other embodiments of the present invention may use other techniques to form the gate oxide layer 28 over only the first, second, and third non-passivation regions 16, 20, 22.

Figure 6:
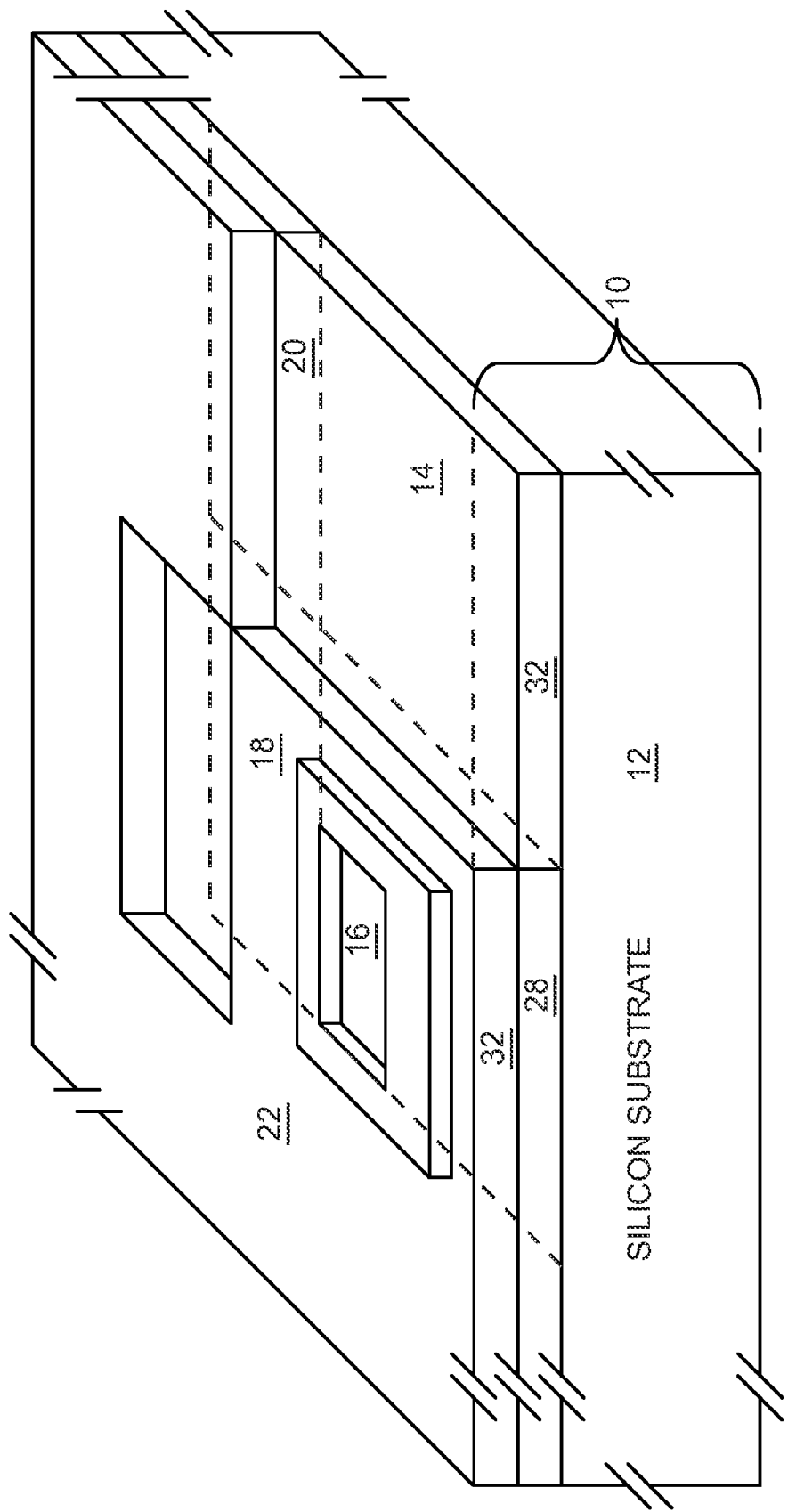
FIG. 6 shows a first polycrystalline Silicon layer added to the first semiconductor wafer illustrated in FIG. 5.

FIG. 6 shows a first polycrystalline Silicon layer 32 added to the first semiconductor wafer 10 illustrated in FIG. 5. The first polycrystalline Silicon layer 32 may be formed over the first, second, and third non-passivation regions 16, 20, 22, over the first and second passivation regions 14, 18, over the isolation oxide 24, over the well 26, or any combination thereof. The first polycrystalline Silicon layer 32 may be formed over the gate oxide layer 28 over the first, second, and third non-passivation regions 16, 20, 22. The first polycrystalline Silicon layer 32 may be formed directly over and may passivate the Silicon substrate 12 over the first and second passivation regions 14, 18. Standard CMOS process techniques may be used to form the first polycrystalline Silicon layer 32.

Figure 7:
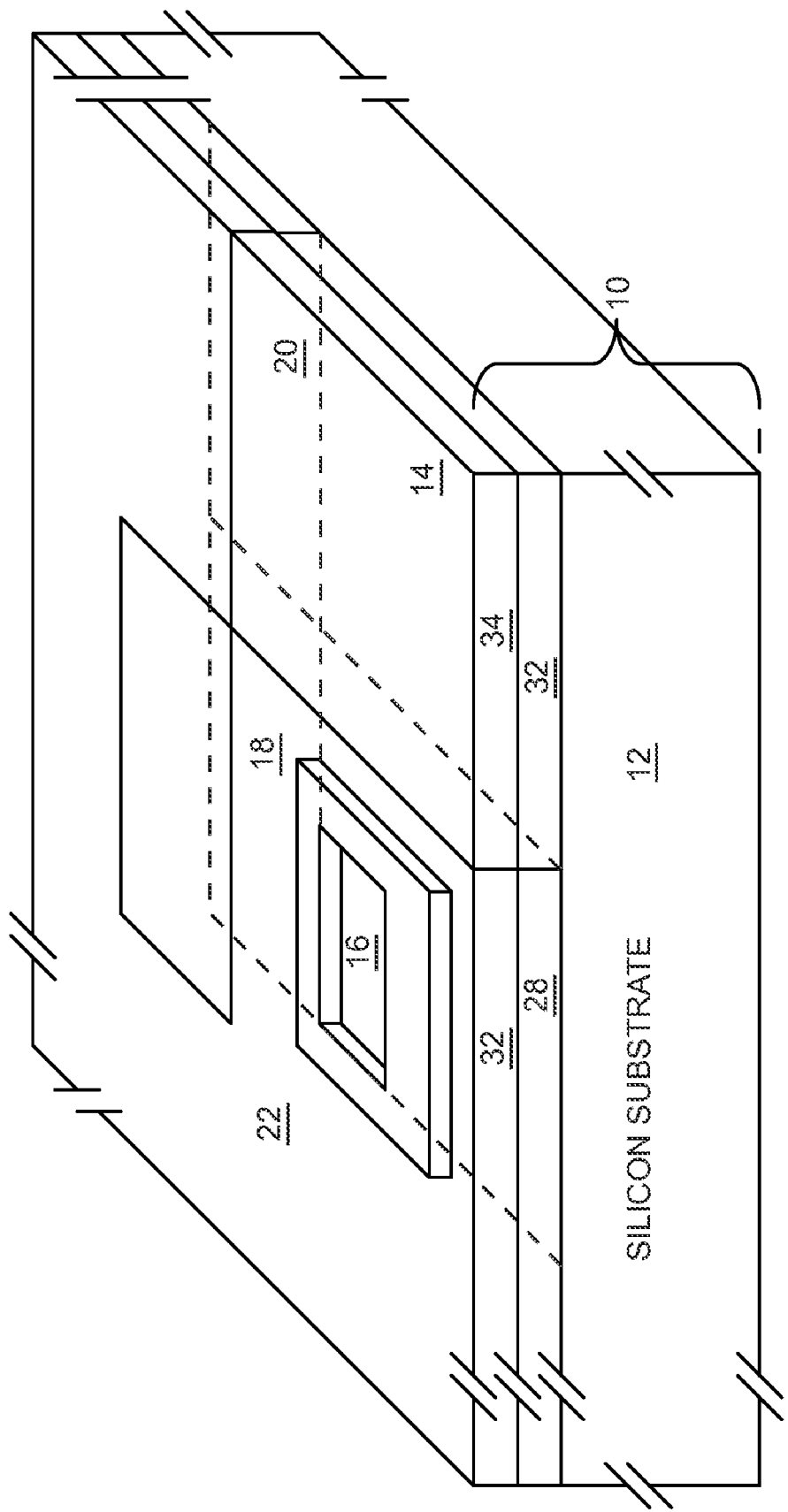
FIG. 7 shows a second patterned photo layer added to the first semiconductor wafer illustrated in FIG. 6.

FIG. 7 shows a second patterned photo layer 34 added to the first semiconductor wafer 10 illustrated in FIG. 6. Standard CMOS process techniques may be used to apply and pattern the second patterned photo layer 34. The second patterned photo layer 34 masks the first polycrystalline Silicon layer 32 over the first and second passivation regions 14, 18, and leaves the first polycrystalline Silicon layer 32 over the first, second, and third non-passivation regions 16, 20, 22 unmasked for doping. The first polycrystalline Silicon layer 32 over the first, second, and third non-passivation regions 16, 20, 22 are doped using a doping technique, such as implant doping, to provide a doped first polycrystalline Silicon layer 36 (not shown). The second patterned photo layer 34 is then removed. Standard CMOS process techniques may be used to dope the first polycrystalline Silicon layer 32 and remove the second patterned photo layer 34.

Figure 8:
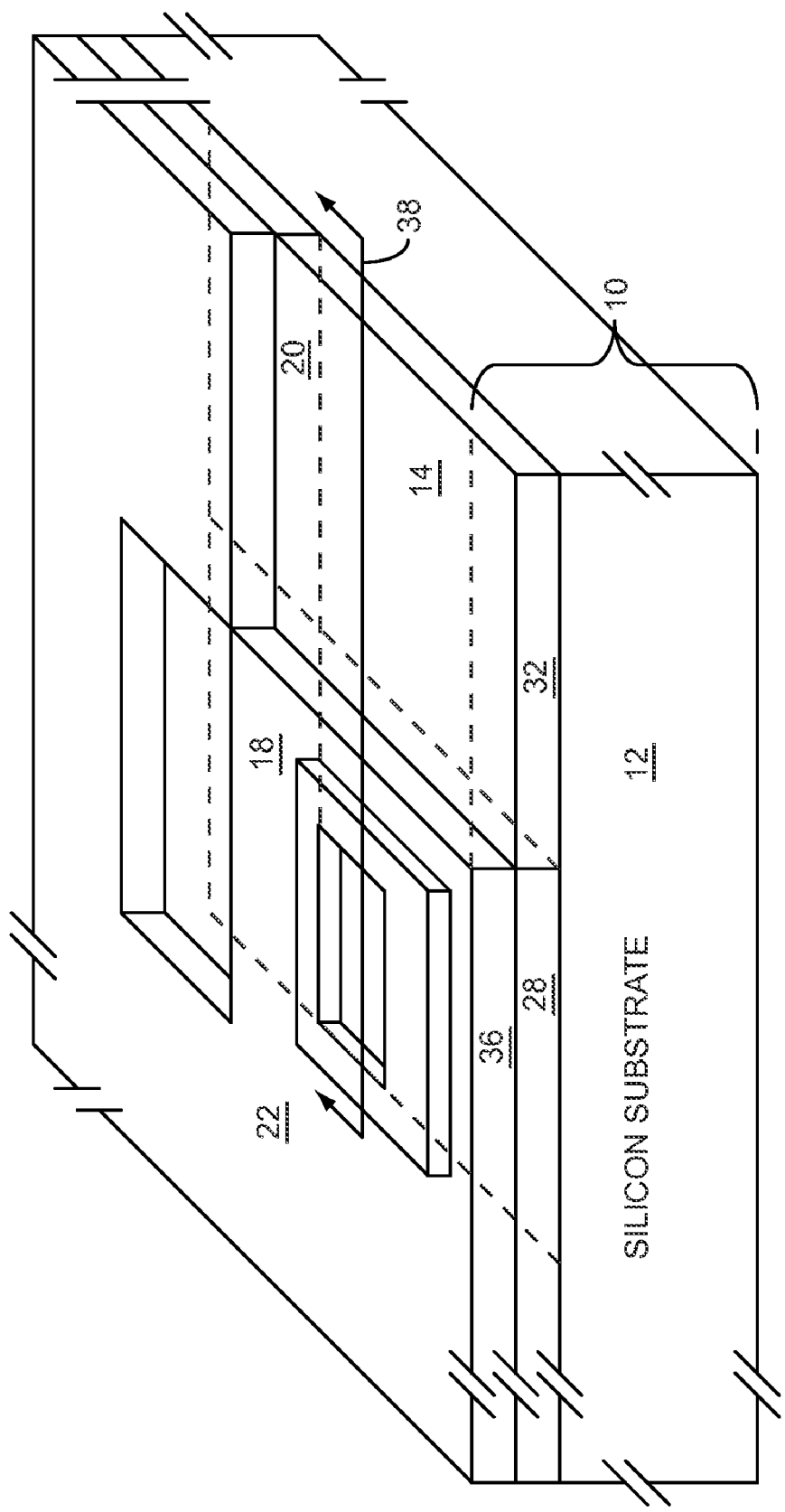
FIG. 8 shows a doped first polycrystalline Silicon layer formed by doping the first polycrystalline Silicon layer over first, second, and third non-passivation regions, and the second patterned photo layer removed from the first semiconductor wafer illustrated in FIG. 7.

FIG. 8 shows the doped first polycrystalline Silicon layer 36 formed by doping the first polycrystalline Silicon layer 32 over the first, second, and third non-passivation regions 16, 20, 22, and the second patterned photo layer 34 removed from the first semiconductor wafer 10 illustrated in FIG. 7. The doped first polycrystalline Silicon layer 36 may include N-type material, P-type material, or both. Other embodiments of the present invention may use other techniques to dope the first polycrystalline Silicon layer 32 over only the first, second, and third non-passivation regions 16, 20, 22. A cross-section 38 of the first semiconductor wafer 10 may be used in subsequent figures to further illustrate the invention.

Figure 9:
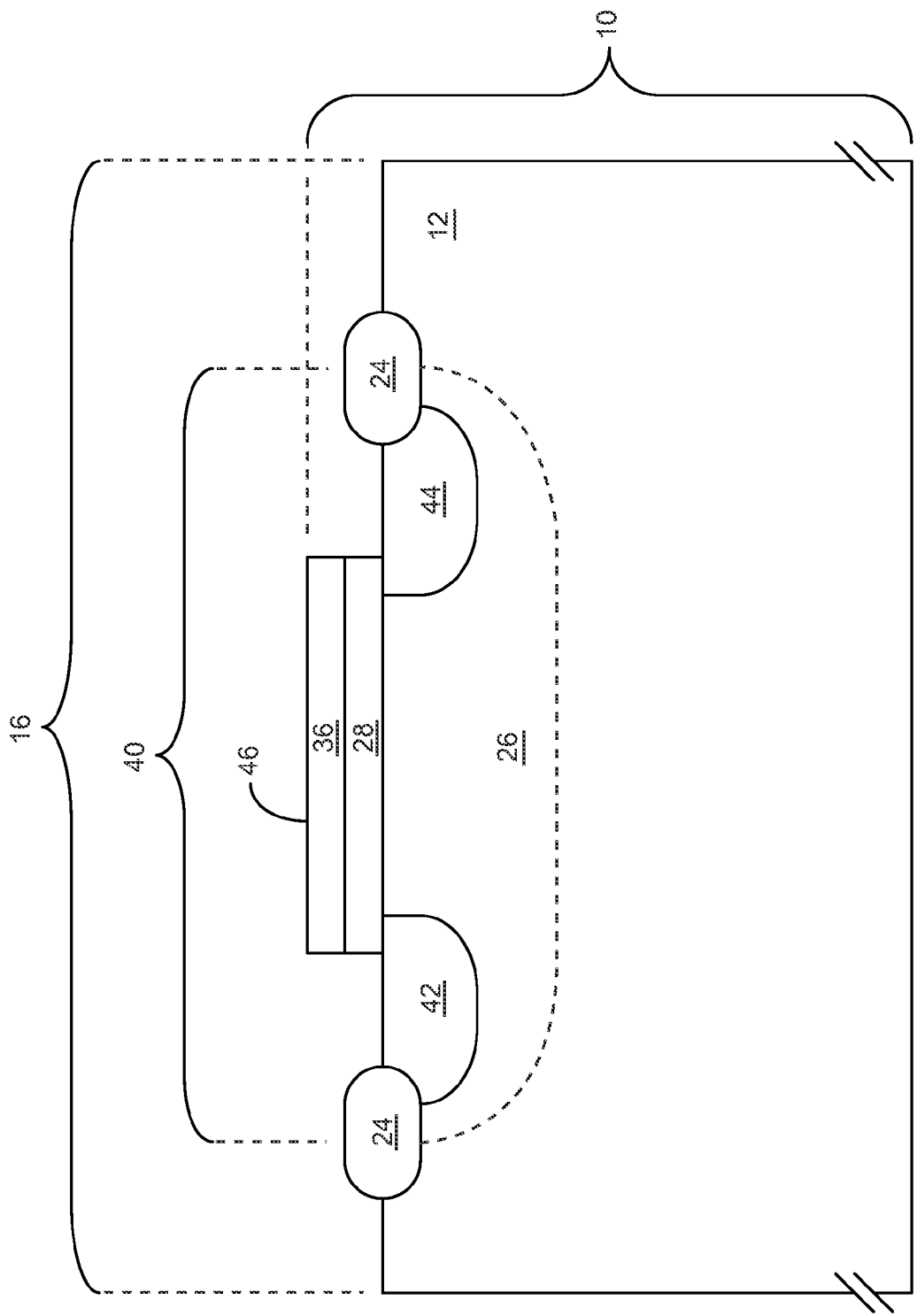
FIG. 9 shows a cross-section of a metal oxide semiconductor (MOS) transistor element formed over the first non-passivation region of the first semiconductor wafer illustrated in FIG. 8.

FIG. 9 shows a cross-section 38 of a MOS transistor element 40 formed over the first non-passivation region 16 of the first semiconductor wafer 10 illustrated in FIG. 8. The MOS transistor element 40 is one example of an active device. Standard CMOS process techniques may be used to form the MOS transistor element 40. The well 26 is formed by doping the Silicon substrate 12 and may be surrounded by the isolation oxide 24, which may separate the MOS transistor element 40 from other devices. A source 42 and a drain 44 are formed by doping the Silicon substrate 12. Between the source 42 and the drain 44 in the Silicon substrate 12 is a channel (not shown), which provides a controllable conduction path between the source 42 and the drain 44. The gate oxide layer 28 and the doped first polycrystalline Silicon layer 36 provide a gate 46, which is located substantially over the channel. The gate oxide layer 28 and the doped first polycrystalline Silicon layer 36 may be removed from the rest of the MOS transistor element 40. A voltage between the gate 46 and the source 42 may control current through the channel. In an N-type MOS (NMOS) transistor element 40, the well 26 is a P-well and the source 42 and the drain 44 include N-type material. In a P-type MOS (PMOS) transistor element 40, the well 26 is an N-well and the source 42 and the drain 44 include P-type material.

Figure 10:
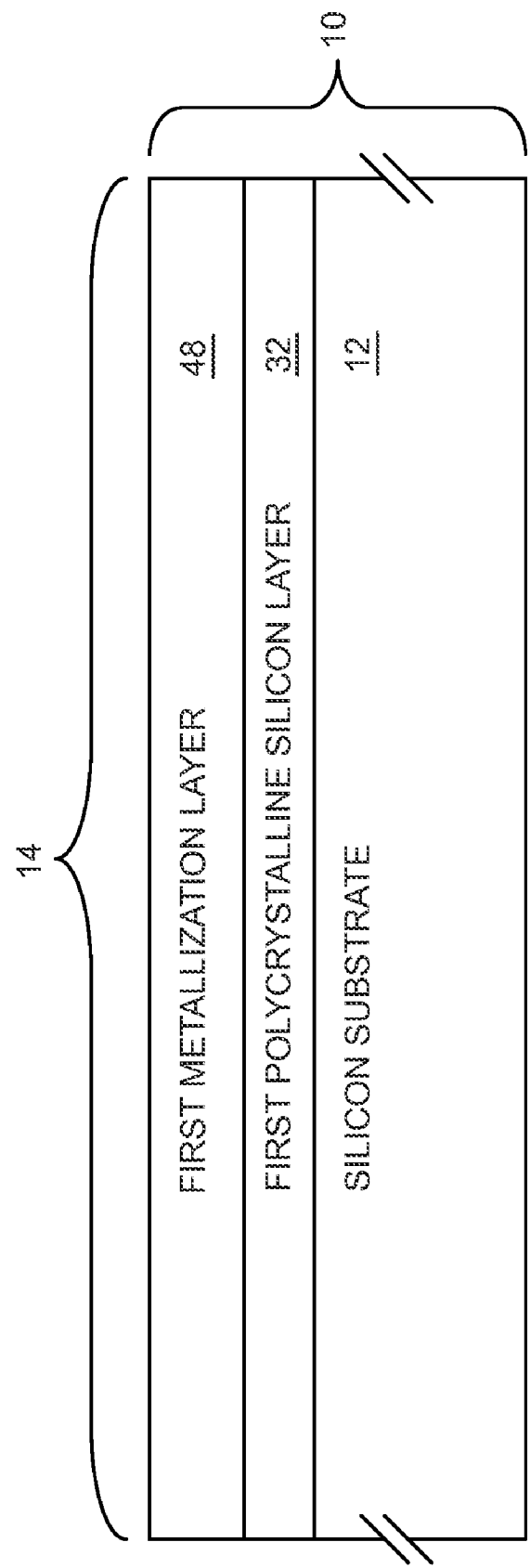
FIG. 10 shows a cross-section of the first passivation region of the first semiconductor wafer illustrated in FIG. 8.

FIG. 10 shows a cross-section 38 of the first passivation region 14 of the first semiconductor wafer 10 illustrated in FIG. 8. The first semiconductor wafer 10 includes the Silicon substrate 12. The first polycrystalline Silicon layer 32 is formed over the Silicon substrate 12. A layer using a different potentially trap-rich material may be used instead of the first polycrystalline Silicon layer 32, according to alternate embodiments of the present invention. In one embodiment of the present invention, an amorphous Silicon film is used instead of the first polycrystalline Silicon layer 32. The amorphous Silicon film may be formed by modifying a top layer of the Silicon substrate 12 to induce a large number of traps. Ions may be implanted to disrupt the Silicon lattice of the Silicon substrate 12 to make it amorphous. A first metallization layer 48 is formed over the first polycrystalline Silicon layer 32. The first polycrystalline Silicon layer 32 may have a high density of traps, which may be used to trap carriers from the Silicon substrate 12, the first polycrystalline Silicon layer 32, or both. Trapping carriers may substantially immobilize a surface conduction layer (not shown) in the Silicon substrate 12. The Silicon substrate 12 may or may not be doped. The Silicon substrate 12 may be doped to form N-type material, P-type material, or both. The first polycrystalline Silicon layer 32 may or may not be doped. The first polycrystalline Silicon layer 32 may be doped to form N-type material, P-type material, or both. However, over the first and second passivation regions 14, 18, the first polycrystalline Silicon layer 32 and the Silicon substrate 12 would normally not be doped or would be doped very lightly. The first polycrystalline Silicon layer 32 may passivate the surface of the Silicon substrate 12. A carrier concentration in the first polycrystalline Silicon layer 32 may be less than a concentration of traps in the first polycrystalline Silicon layer 32. A thickness of the first polycrystalline Silicon layer 32 may be greater than about 100 nanometers. An average release time of a carrier in a trap in the first polycrystalline Silicon layer 32 may be greater than about 100 microseconds. In an exemplary embodiment of the present invention, the average release time of a carrier in a trap in the first polycrystalline Silicon layer 32 is greater than about one millisecond.

The first polycrystalline Silicon layer 32 may be in electrical contact with the Silicon substrate 12. The Silicon substrate 12 may have a thin oxide layer (not shown), which may have a thickness of less than about 20 angstroms and may be formed natively by exposure to air, or may be formed when the first polycrystalline Silicon layer 32 is formed over the Silicon substrate 12. The thin oxide layer may be formed based on the process technique used to add the first polycrystalline Silicon layer 32, such as low pressure chemical vapor deposition (LPCVD). However, the thin oxide layer does not interfere with carrier transfer between the first polycrystalline Silicon layer 32 and the Silicon substrate 12, such that carriers transfer freely between the first polycrystalline Silicon layer 32 and the Silicon substrate 12. The Silicon substrate 12 may have a majority carrier relaxation time, which may be about equal to a resistivity of the Silicon substrate 12 times a dielectric permittivity of the Silicon substrate 12. In an exemplary embodiment of the present invention, the thickness of the first polycrystalline Silicon layer 32 may be equal to about 300 nanometers. The resistivity of the Silicon substrate 12 may be greater than about 1000 ohm·centimeters. The dielectric permittivity of the Silicon substrate 12 may be equal to about one picofarad per centimeter. The majority carrier relaxation time of the Silicon substrate 12 may be equal to about one nanosecond. Alternate embodiments of the present invention may include one or more intervening layers between the Silicon substrate 12 and the first polycrystalline Silicon layer 32, between the first polycrystalline Silicon layer 32 and the first metallization layer 48, or both. However, any intervening layers between the Silicon substrate 12 and the first polycrystalline Silicon layer 32 must not interfere with carrier transfer between the first polycrystalline Silicon layer 32 and the Silicon substrate 12.

Figure 11:
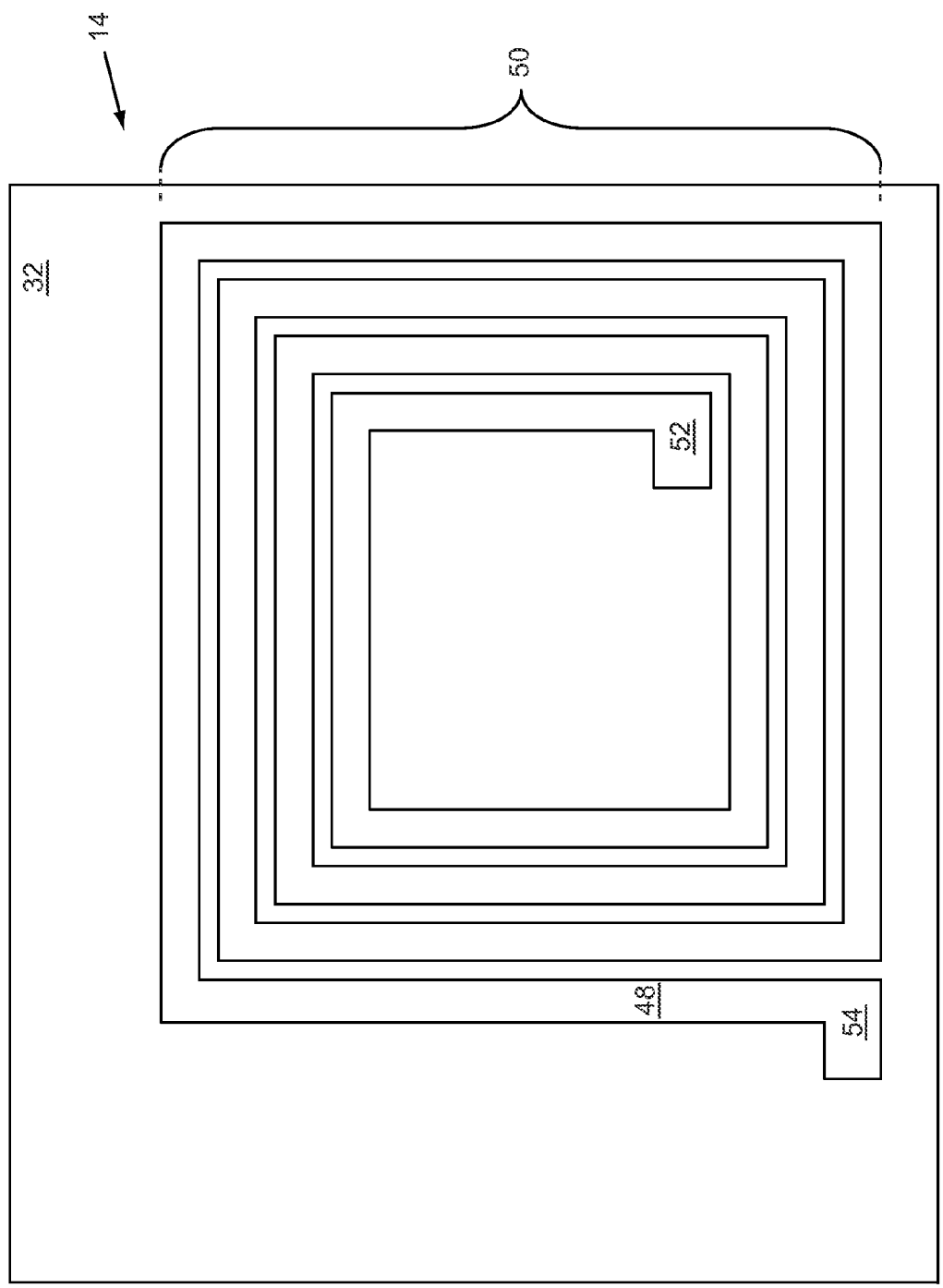
FIG. 11 shows a radio frequency (RF) inductive element formed over the first passivation region of the first semiconductor wafer illustrated in FIG. 10.

FIG. 11 shows a top view of an RF inductive element 50 formed over the first passivation region 14 of the first semiconductor wafer 10 illustrated in FIG. 10. The RF inductive element 50 may be formed using the first metallization layer 48 over the first polycrystalline Silicon layer 32 and may include a first inductive terminal 52 conductively coupled to a second inductive terminal 54. The RF inductive element 50 may have an inductance and may be associated with an RF signal, which may have an RF signal period that is less than or equal to the majority carrier relaxation time of the Silicon substrate 12. In an exemplary embodiment of the present invention, the majority carrier relaxation time of the Silicon substrate 12 is equal to about one nanosecond and the RF signal period is less than or equal to about one nanosecond.

Figure 12:
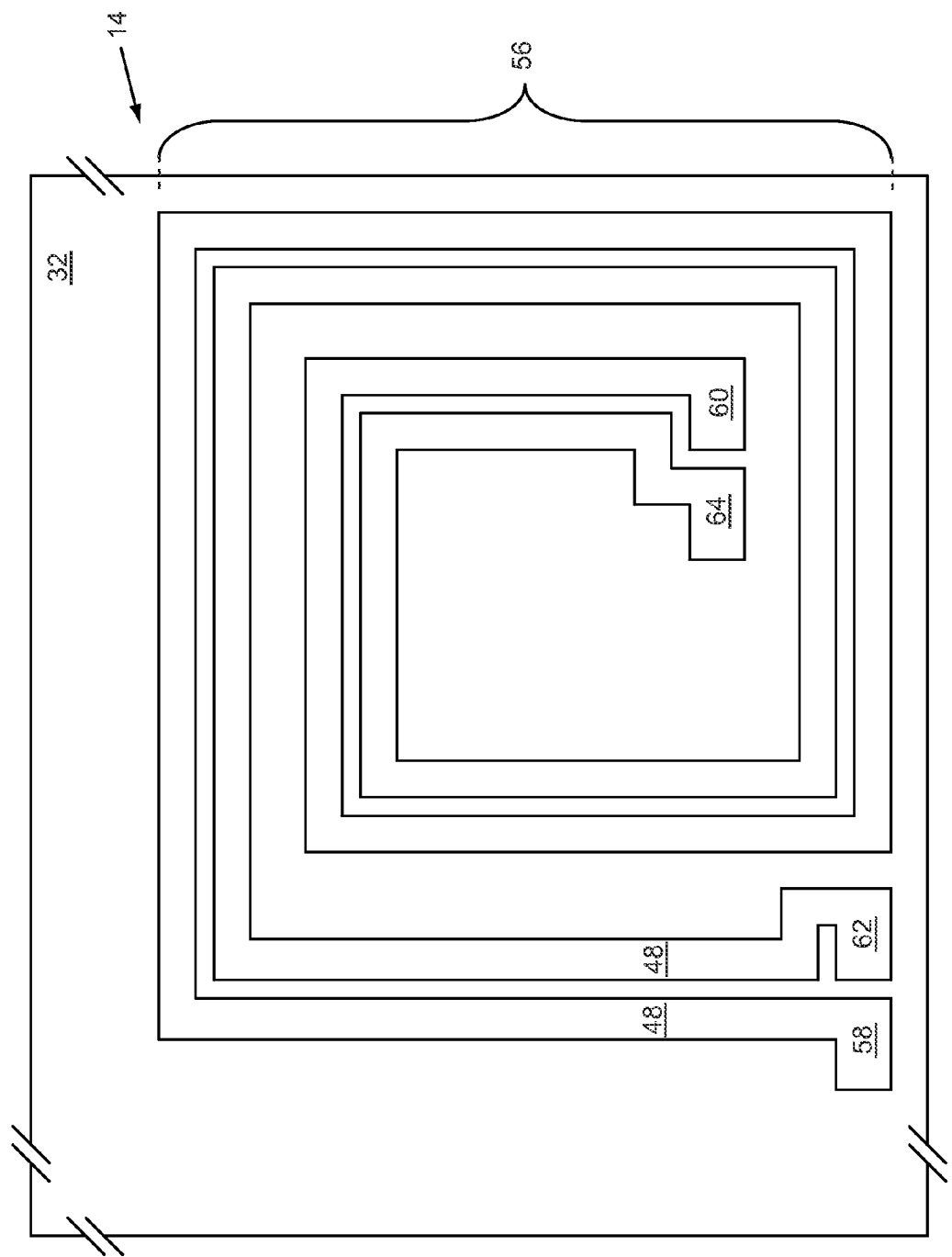
FIG. 12 shows an RF coupler formed over the first passivation region of the first semiconductor wafer illustrated in FIG. 10.

FIG. 12 shows a top view of an RF coupler 56 formed over the first passivation region 14 of the first semiconductor wafer 10 illustrated in FIG. 10. The RF coupler 56 may be formed using the first metallization layer 48 over the first polycrystalline Silicon layer 32 and may include a first coupler terminal 58 conductively coupled to a second coupler terminal 60, and a third coupler terminal 62 conductively coupled to a fourth coupler terminal 64. The first and second coupler terminals 58, 60 may be magnetically coupled to the third and fourth coupler terminals 62, 64. The RF coupler 56 may be associated with an RF signal, which may have an RF signal period that is less than or equal to the majority carrier relaxation time of the Silicon substrate 12. In an exemplary embodiment of the present invention, the majority carrier relaxation time of the Silicon substrate 12 is equal to about one nanosecond and the RF signal period is less than or equal to about one nanosecond.

Figure 13:
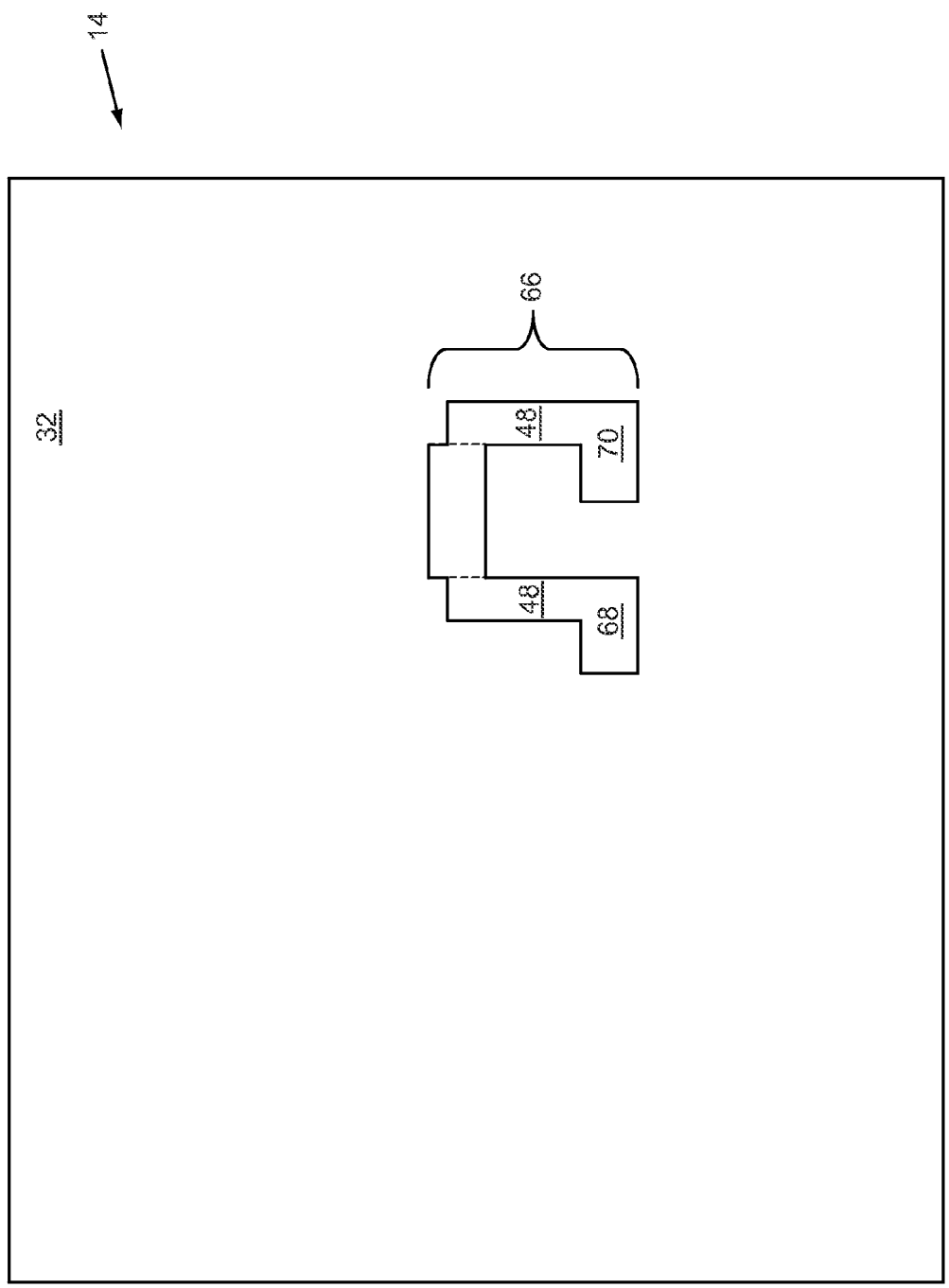
FIG. 13 shows a micro-electromechanical systems (MEMS) RF switch formed over the first passivation region of the first semiconductor wafer illustrated in FIG. 10.

FIG. 13 shows a top view of a MEMS RF switch 66 formed over the first passivation region 14 of the first semiconductor wafer 10 illustrated in FIG. 10. The MEMS RF switch 66 may be formed using the first metallization layer 48 over the first polycrystalline Silicon layer 32 and may include a first MEMS terminal 68 and a second MEMS terminal 70. When the MEMS RF switch 66 is in a closed state, the first MEMS terminal 68 may be conductively coupled to the second MEMS terminal 70. When the MEMS RF switch 66 is in an open state, the first MEMS terminal 68 may be electrically isolated from the second MEMS terminal 70. The MEMS RF switch 66 may be associated with an RF signal, which may have an RF signal period that is less than or equal to the majority carrier relaxation time of the Silicon substrate 12. In an exemplary embodiment of the present invention, the majority carrier relaxation time of the Silicon substrate 12 is equal to about one nanosecond and the RF signal period is less than or equal to about one nanosecond. Alternate embodiments of the present invention may provide other MEMS devices by the first semiconductor wafer 10 illustrated in FIG. 10. The other MEMS devices may be formed using the first metallization layer 48.

Figure 14:
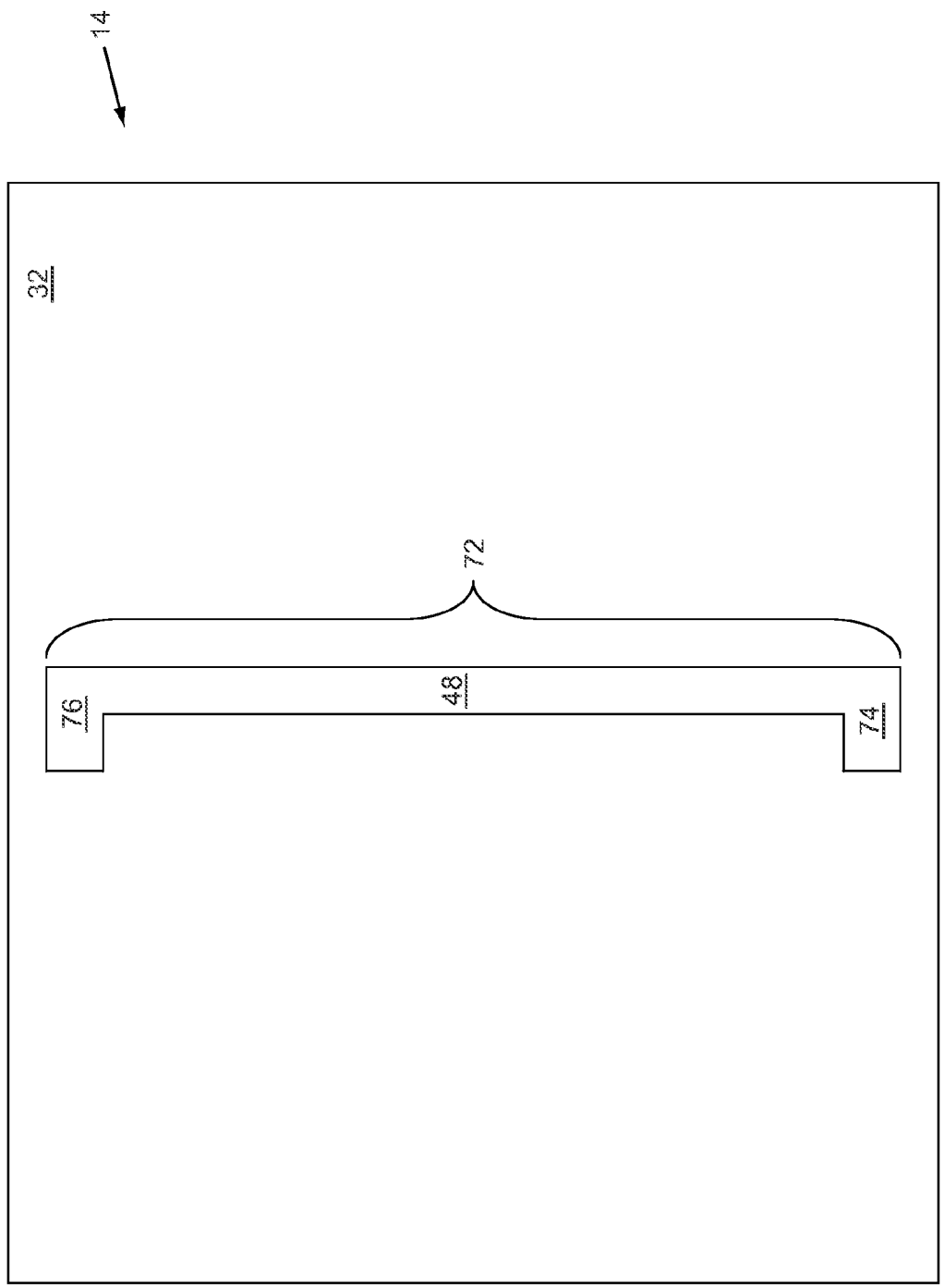
FIG. 14 shows an RF transmission line formed over the first passivation region of the first semiconductor wafer illustrated in FIG. 10.

FIG. 14 shows a top view of an RF transmission line 72 formed over the first passivation region 14 of the first semiconductor wafer 10 illustrated in FIG. 10. The RF transmission line 72 may be formed using the first metallization layer 48 over the first polycrystalline Silicon layer 32 and may include a first transmission line terminal 74 conductively coupled to a second transmission line terminal 76. The RF transmission line 72 may have a characteristic impedance and may be associated with an RF signal, which may have an RF signal period that is less than or equal to the majority carrier relaxation time of the Silicon substrate 12. In an exemplary embodiment of the present invention, the majority carrier relaxation time of the Silicon substrate 12 is equal to about one nanosecond and the RF signal period is less than or equal to about one nanosecond.

Figure 15:
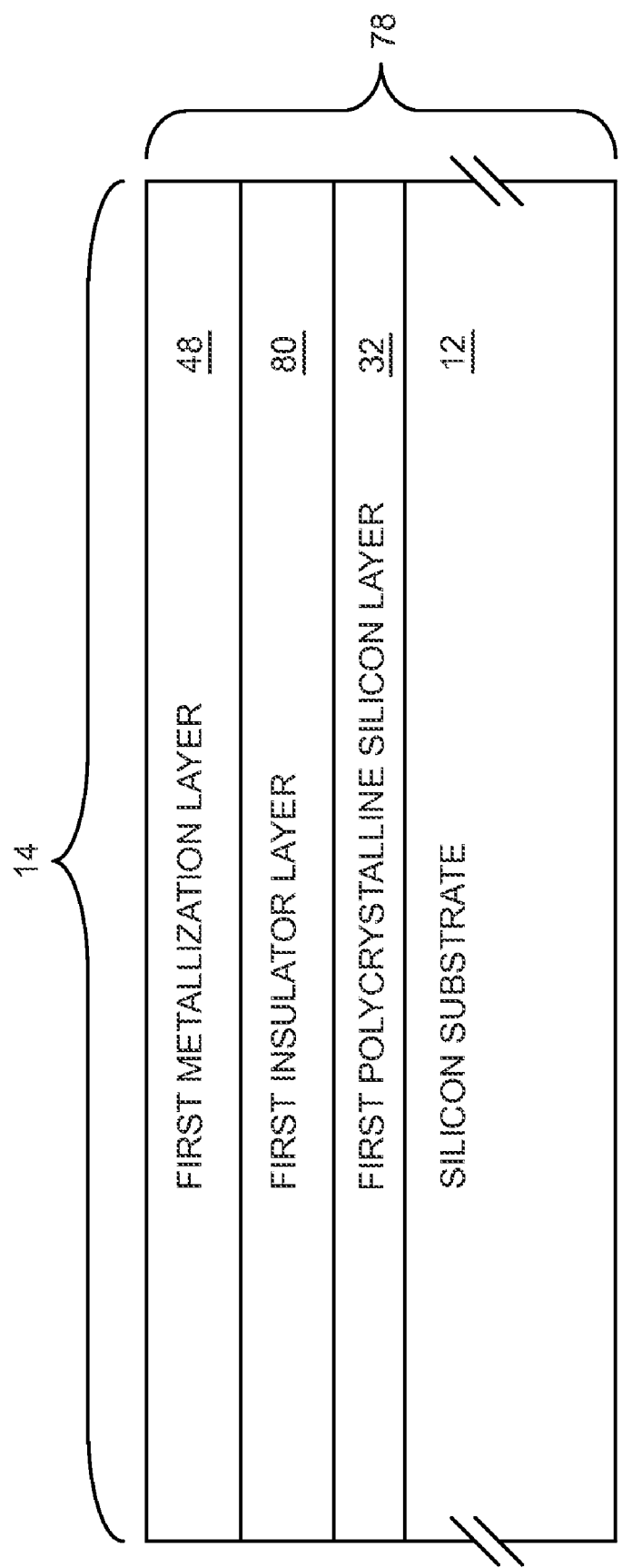
FIG. 15 shows a cross-section of a first passivation region of a second semiconductor wafer, according to an alternate embodiment of the present invention.

FIG. 15 shows a cross-section of the first passivation region 14 of a second semiconductor wafer 78, according to an alternate embodiment of the present invention. A first insulator layer 80 may be formed over the first polycrystalline Silicon layer 32, and the first metallization layer 48 may be formed over the first insulator layer 80. A layer using a different potentially trap-rich material may be used instead of the first polycrystalline Silicon layer 32, according to alternate embodiments of the present invention. In one embodiment of the present invention, an amorphous Silicon film is used instead of the first polycrystalline Silicon layer 32. The amorphous Silicon film may be formed by modifying a top layer of the Silicon substrate 12 to induce a large number of traps. Ions may be implanted to disrupt the Silicon lattice of the Silicon substrate 12 to make it amorphous. The first insulator layer 80 may include dielectric material. In a first embodiment of the present invention, the first insulator layer 80 includes Silicon Dioxide. In a second embodiment of the present invention, the first insulator layer 80 includes Silicon Nitride.

Alternate embodiments of the present invention may include one or more intervening layers between the Silicon substrate 12 and the first polycrystalline Silicon layer 32, between the first polycrystalline Silicon layer 32 and the first insulator layer 80, between the first insulator layer 80 and the first metallization layer 48, or any combination thereof. The second semiconductor wafer 78 may include the RF inductive element 50 (not shown), the RF coupler 56 (not shown), the MEMS RF switch 66 (not shown), the RF transmission line 72 (not shown), other passive devices, or any combination thereof. Other embodiments of the present invention may use another semiconductor substrate in place of the Silicon substrate 12, such as Gallium Arsenide. According to one embodiment of the present invention, the first and second passivation regions 14, 18 of the Silicon substrate 12 are protected from silicide formation during processing of the second semiconductor wafer 78.

Figure 16:
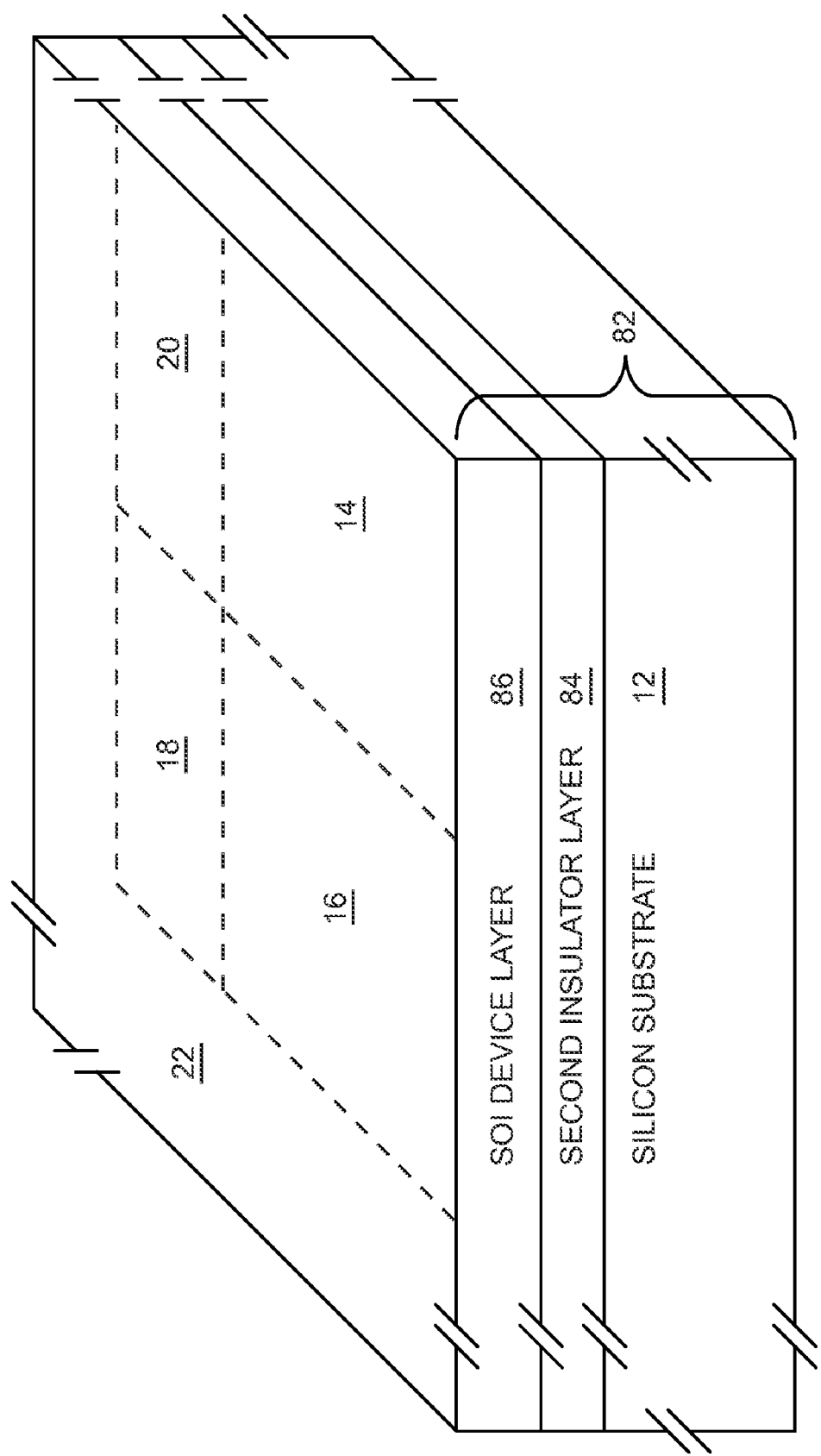
FIG. 16 shows a three-dimensional view of a first Silicon-on-insulator (SOI) wafer, according to an additional embodiment of the present invention.

FIG. 16 shows a three-dimensional view of a first SOI wafer 82, according to an additional embodiment of the present invention. The first SOI wafer 82 includes the Silicon substrate 12. A second insulator layer 84 is formed over the Silicon substrate 12, and an SOI device layer 86 is formed over the second insulator layer 84. The SOI device layer 86 has the first passivation region 14, the first non-passivation region 16, the second passivation region 18, the second non-passivation region 20, and the third non-passivation region 22. One or more active devices may be formed over the first, second, and third non-passivation regions 16, 20, 22, and one or more passive devices may be formed over the first and second passivation regions 14, 18. Other embodiments of the present invention may have any number of passivation regions providing any number of passive devices, active devices, or both, and any number of non-passivation regions providing any number of passive devices, active devices, or both. Other embodiments of the present invention may use another semiconductor substrate in place of the Silicon substrate 12, such as Gallium Arsenide. According to one embodiment of the present invention, the first and second passivation regions 14, 18 of the SOI device layer 86 are protected from silicide formation during processing of the first SOI wafer 82.

Figure 17:
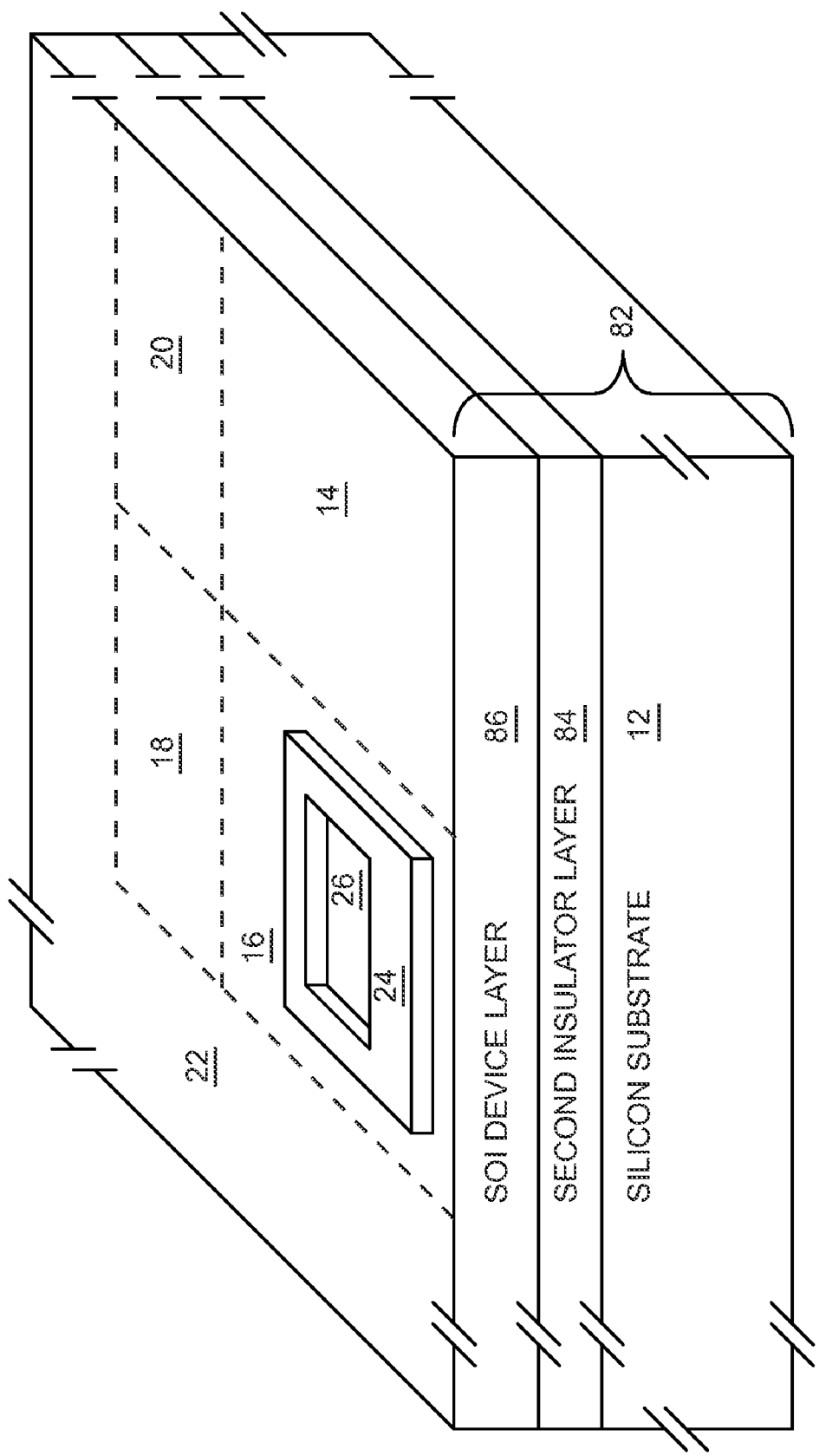
FIG. 17 shows the isolation oxide and the well added to the first SOI wafer illustrated in FIG. 16.

FIG. 17 shows the isolation oxide 24 and the well 26 added to the first SOI wafer 82 illustrated in FIG. 16. The isolation oxide 24 may surround the well 26. Standard CMOS process techniques may be used to add the isolation oxide 24 and the well 26. Standard CMOS process techniques may include layer formation, such as application, growth, deposition, and oxidation; doping, such as implanting; masking, such as photo layer application and patterning; and removal, such as wet etching, dry etching, and lift-off. The well 26 may be P-well or an N-well. Other embodiments of the present invention may include any number of N-wells, any number of P-wells, additional isolation oxide 24, or any combination thereof.

Figure 18:
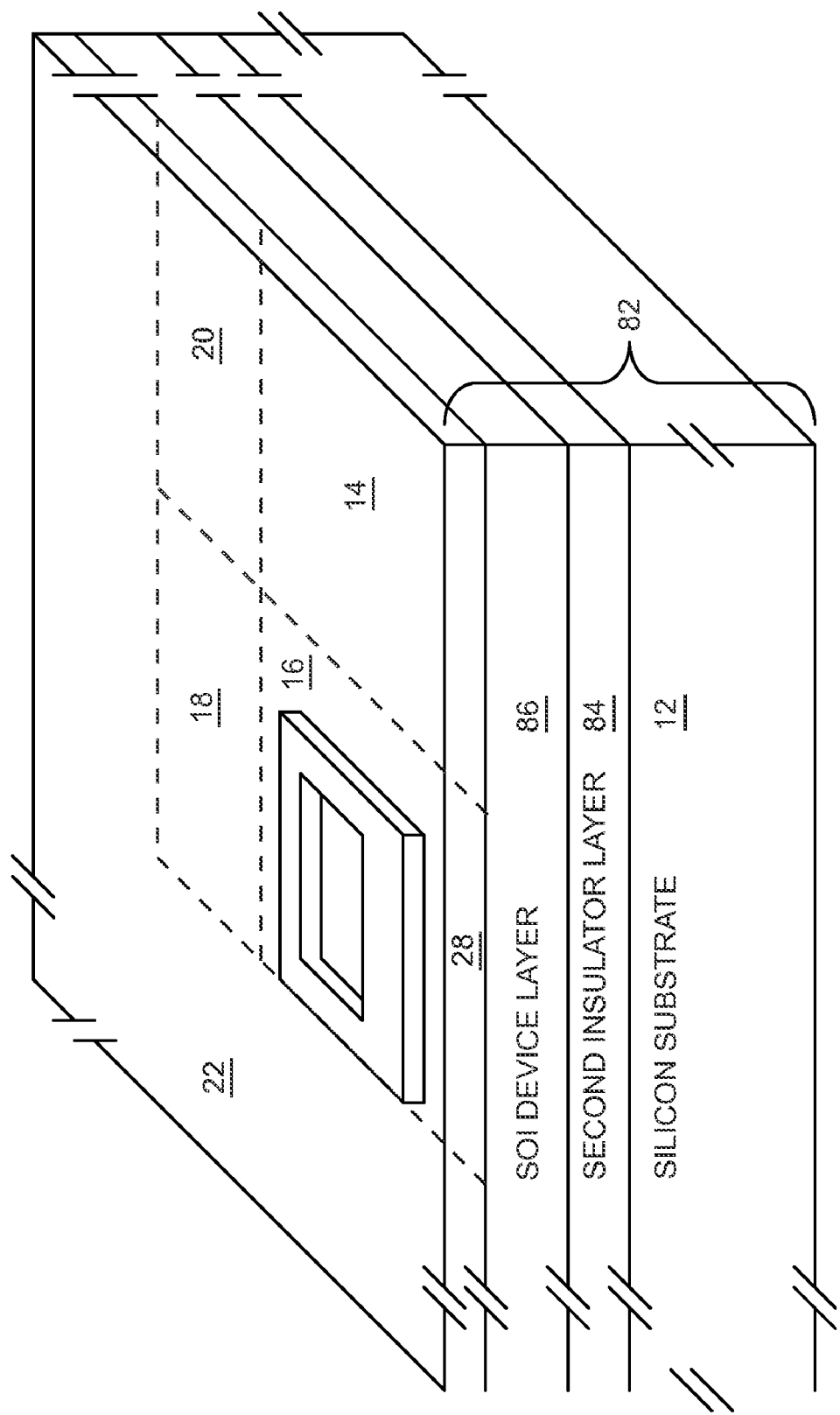
FIG. 18 shows the gate oxide layer added to the first SOI wafer illustrated in FIG. 17.

FIG. 18 shows the gate oxide layer 28 added to the first SOI wafer 82 illustrated in FIG. 17. The gate oxide layer 28 may be formed over the first, second, and third non-passivation regions 16, 20, 22, over the first and second passivation regions 14, 18, over the isolation oxide 24, over the well 26, or any combination thereof. Standard CMOS process techniques may be used to form the gate oxide layer 28.

Figure 19:
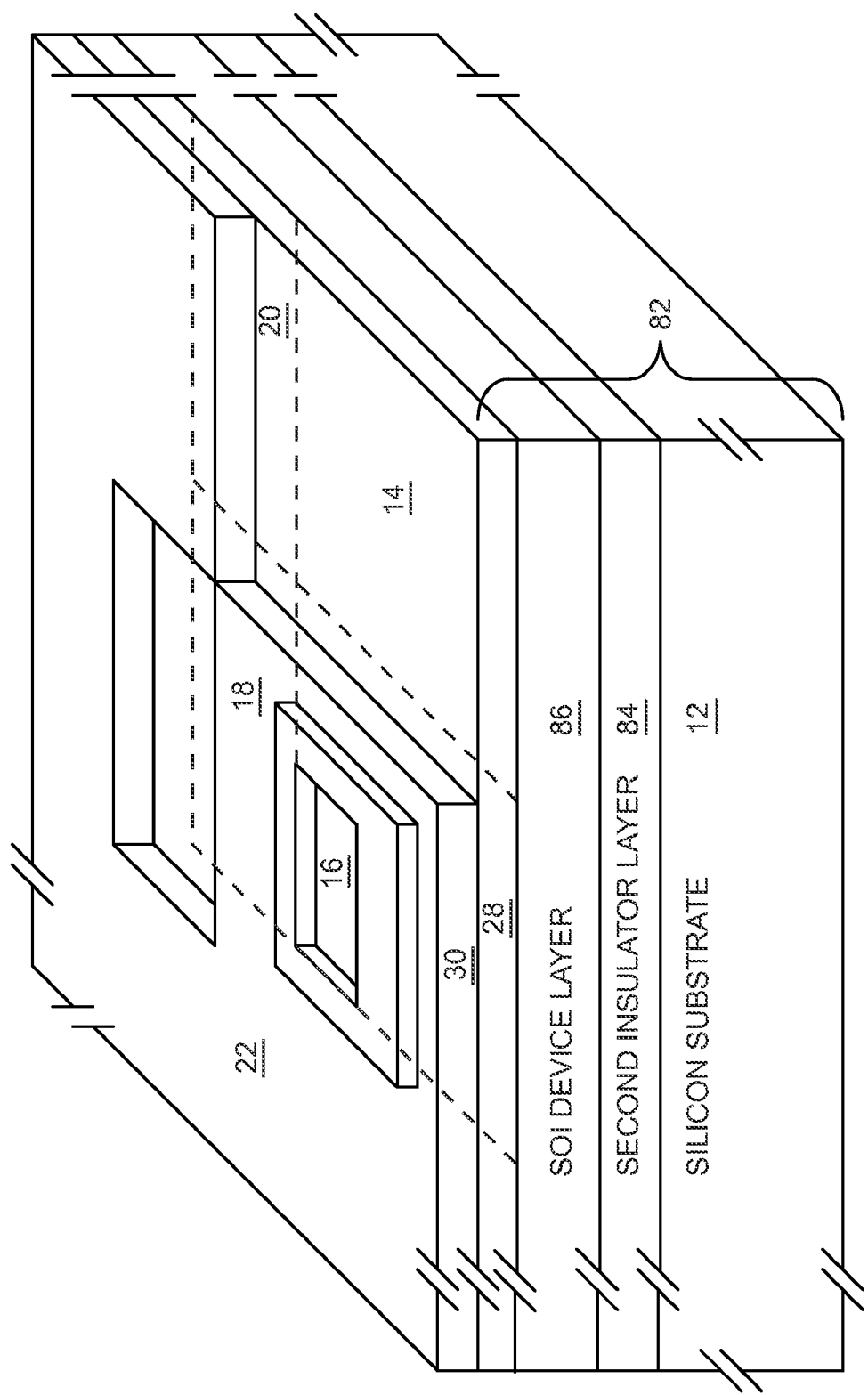
FIG. 19 shows the first patterned photo layer added to the first SOI wafer illustrated in FIG. 18.

FIG. 19 shows the first patterned photo layer 30 added to the first SOI wafer 82 illustrated in FIG. 18. Standard CMOS process techniques may be used to apply and pattern the first patterned photo layer 30. The first patterned photo layer 30 masks the gate oxide layer 28 over the first, second, and third non-passivation regions 16, 20, 22, and leaves the first and second passivation regions 14, 18 unmasked. The gate oxide layer 28 over the first and second passivation regions 14, 18 are then etched using an etching process, such as a wet etch, to remove the gate oxide layer 28 over the first and second passivation regions 14, 18. The first patterned photo layer 30 is then removed. Standard CMOS process techniques may be used to etch the gate oxide layer 28 and remove the first patterned photo layer 30.

Figure 20:
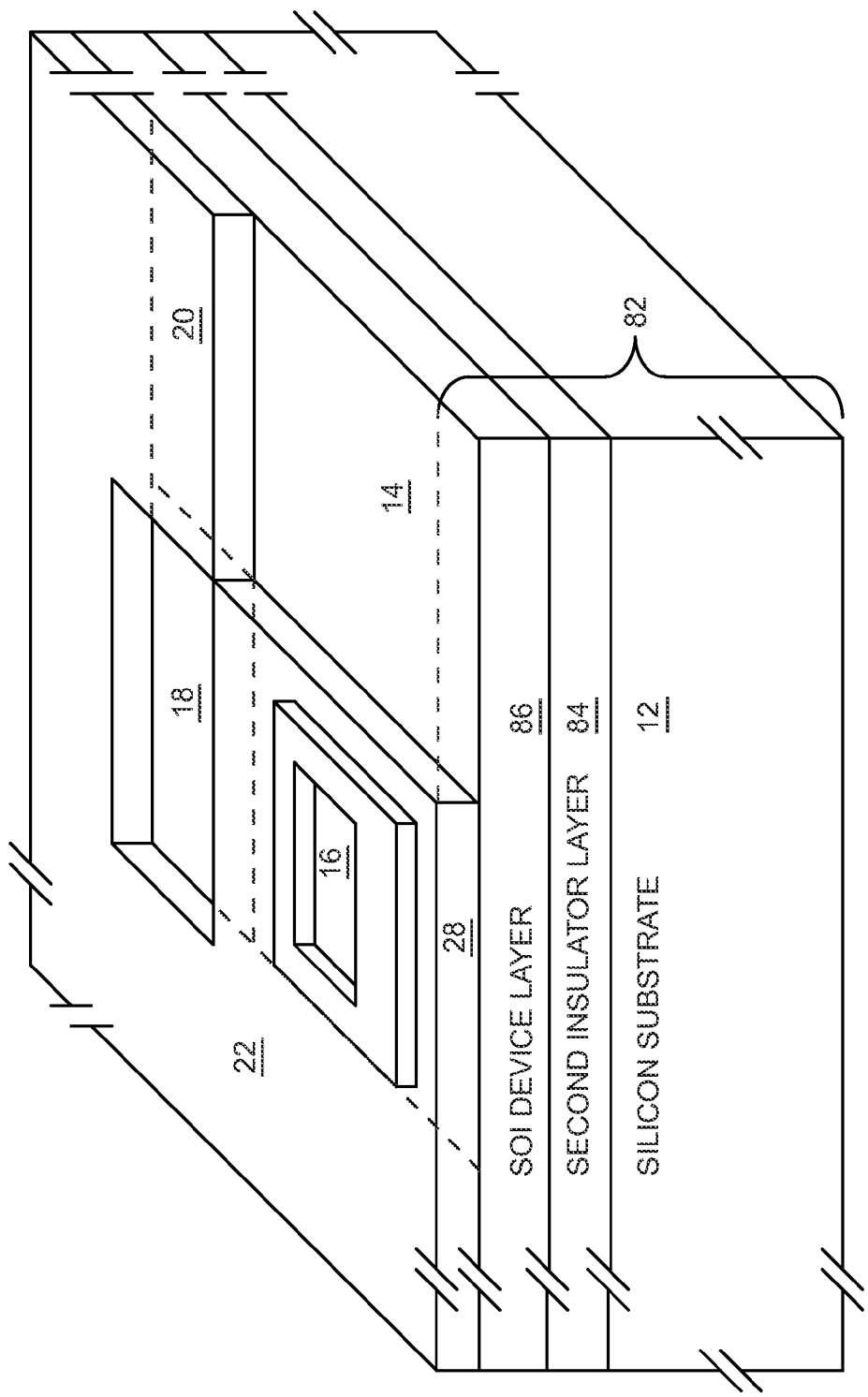
FIG. 20 shows the gate oxide layer removed from the first and second passivation regions, and the first patterned photo layer removed from the first SOI wafer illustrated in FIG. 19.

FIG. 20 shows the gate oxide layer 28 removed from the first and second passivation regions 14, 18 and the first patterned photo layer 30 removed from the first SOI wafer 82 illustrated in FIG. 19. Other embodiments of the present invention may use other techniques to form the gate oxide layer 28 over only the first, second, and third non-passivation regions 16, 20, 22.

Figure 21:
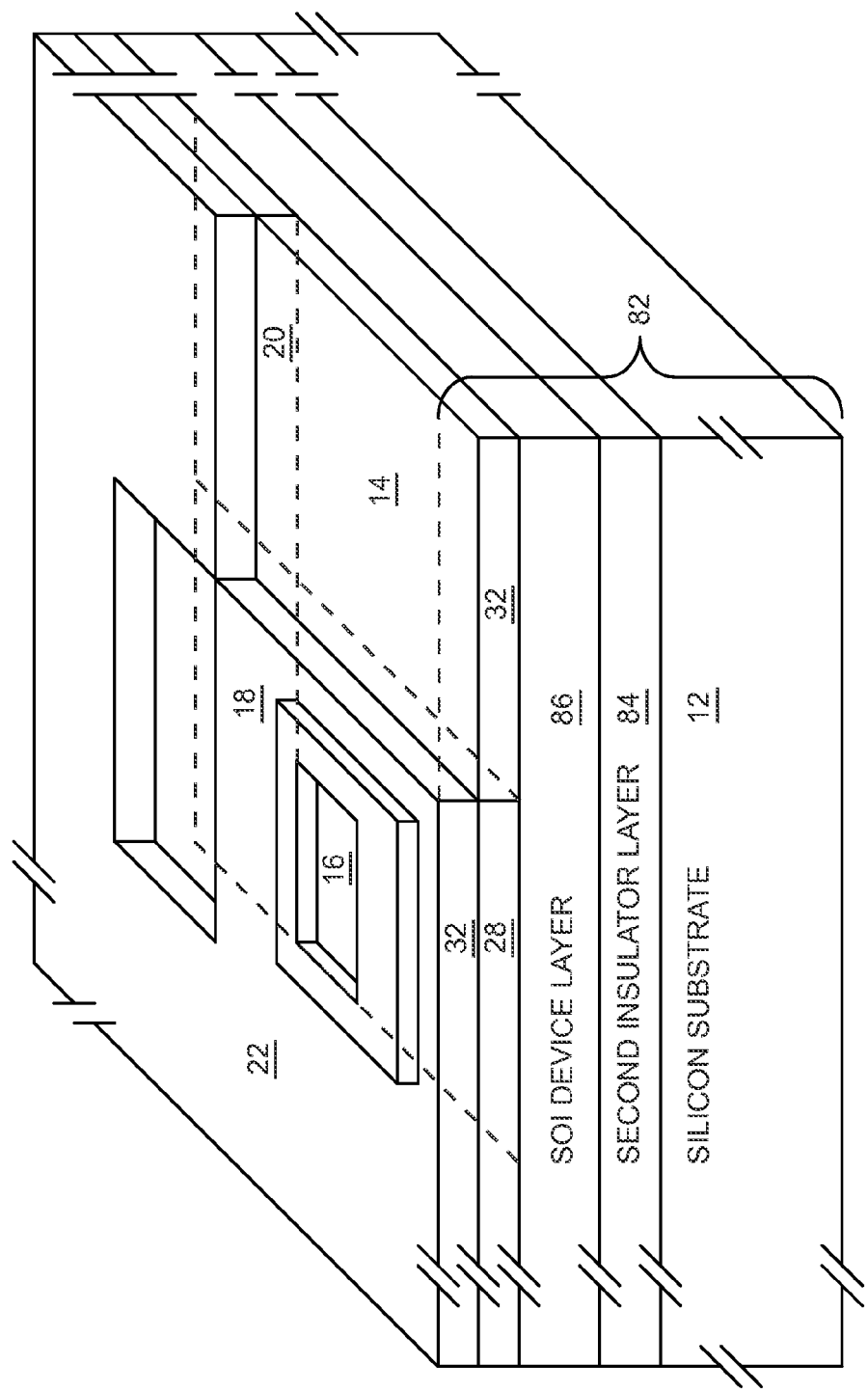
FIG. 21 shows the first polycrystalline Silicon layer added to the first SOI wafer illustrated in FIG. 20.

FIG. 21 shows the first polycrystalline Silicon layer 32 added to the first SOI wafer 82 illustrated in FIG. 20. The first polycrystalline Silicon layer 32 may be formed over the first, second, and third non-passivation regions 16, 20, 22, over the first and second passivation regions 14, 18, over the isolation oxide 24, over the well 26, or any combination thereof. The first polycrystalline Silicon layer 32 may be formed over the gate oxide layer 28 over the first, second, and third non-passivation regions 16, 20, 22. The first polycrystalline Silicon layer 32 may be formed directly over and may passivate the Silicon substrate 12 over the first and second passivation regions 14, 18. Standard CMOS process techniques may be used to form the first polycrystalline Silicon layer 32.

Figure 22:
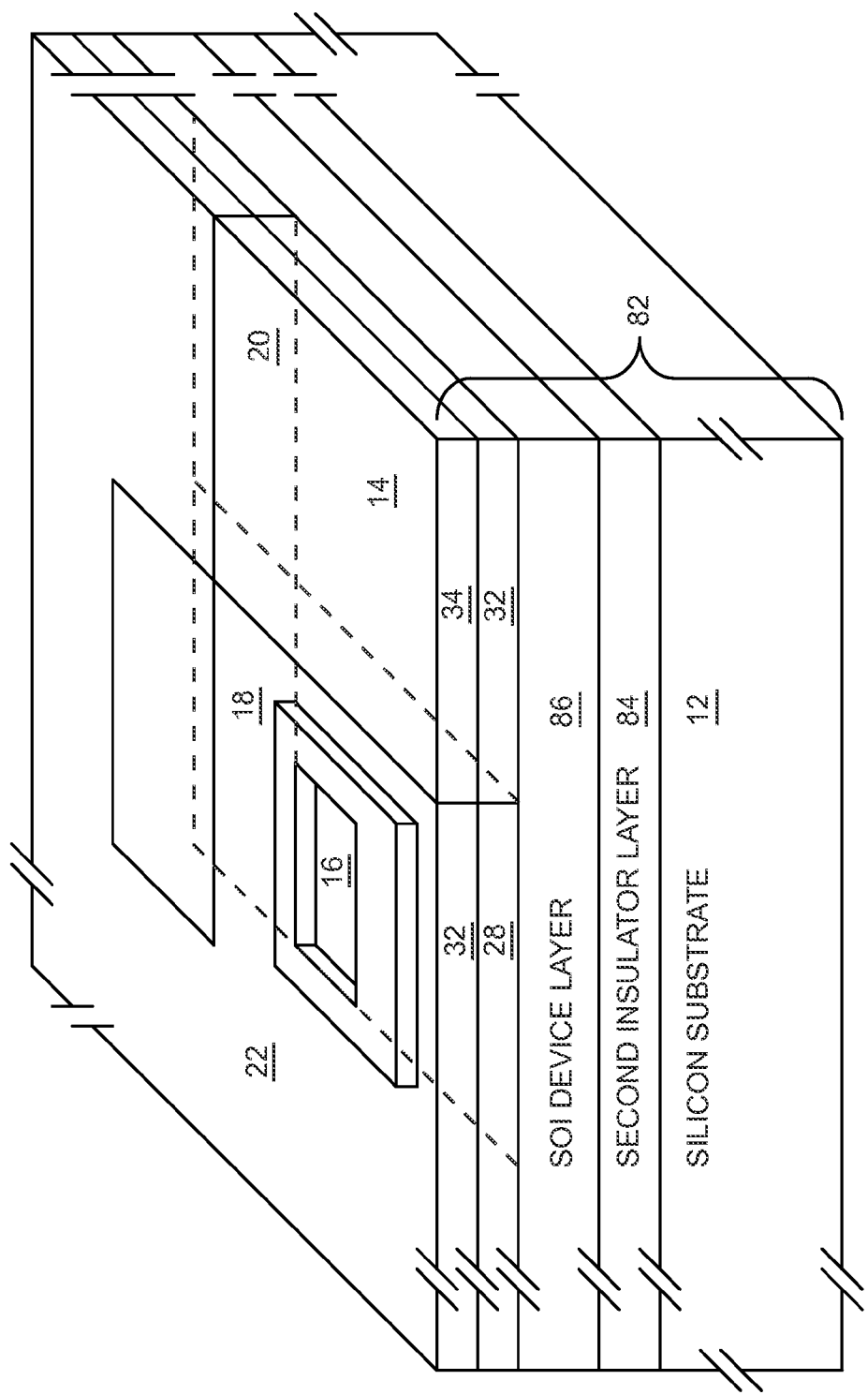
FIG. 22 shows the second patterned photo layer added to the first SOI wafer illustrated in FIG. 21.

FIG. 22 shows the second patterned photo layer 34 added to the first SOI wafer 82 illustrated in FIG. 21. Standard CMOS process techniques may be used to apply and pattern the second patterned photo layer 34. The second patterned photo layer 34 masks the first polycrystalline Silicon layer 32 over the first and second passivation regions 14, 18, and leaves the first polycrystalline Silicon layer 32 over the first, second, and third non-passivation regions 16, 20, 22 unmasked for doping. The first polycrystalline Silicon layer 32 over the first, second, and third non-passivation regions 16, 20, 22 are doped using a doping technique, such as implant doping, to provide the doped first polycrystalline Silicon layer 36 (not shown). The second patterned photo layer 34 is then removed.

Standard CMOS process techniques may be used to dope the first polycrystalline Silicon layer 32 and remove the second patterned photo layer 34.

Figure 23:
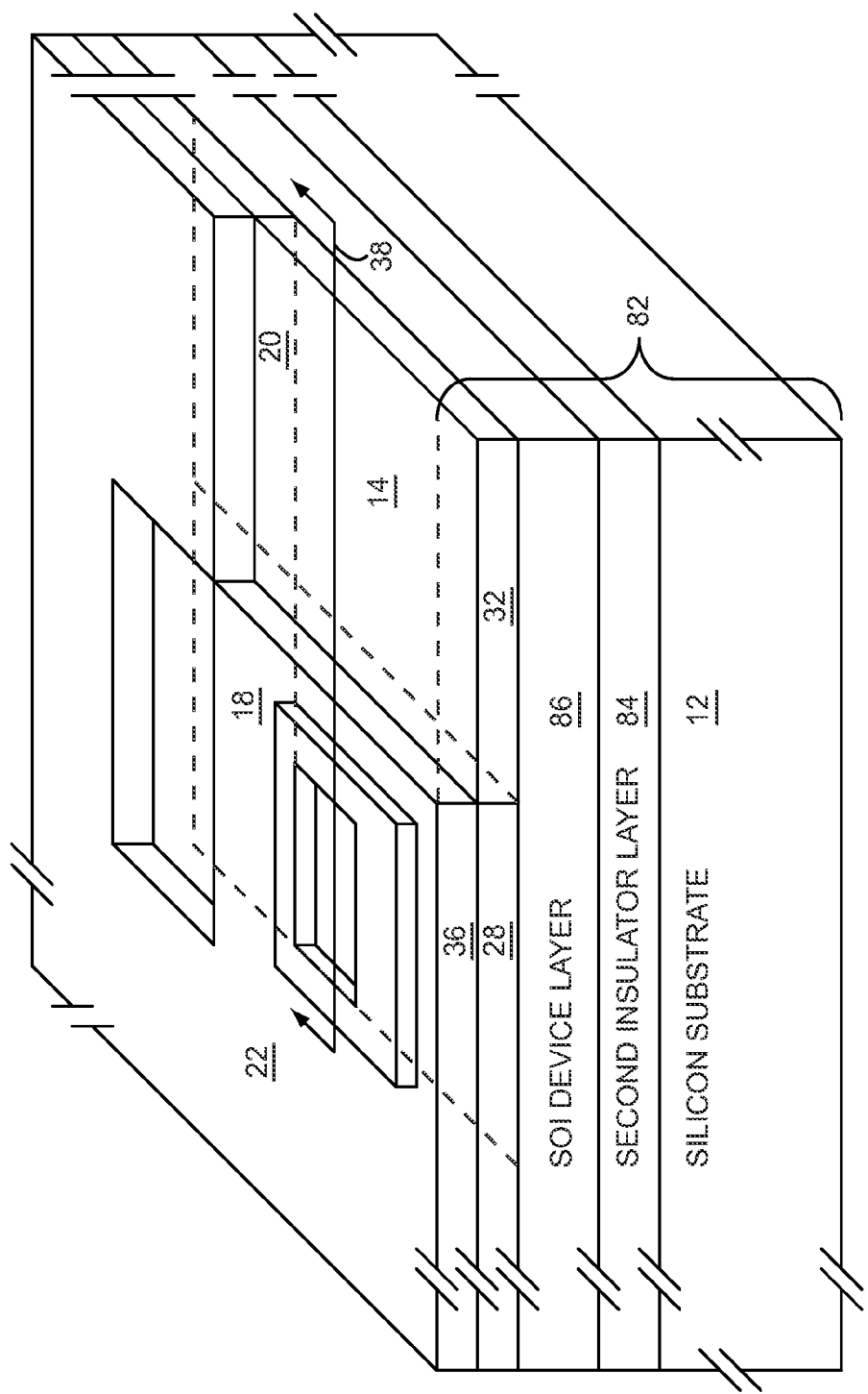
FIG. 23 shows the doped first polycrystalline Silicon layer formed by doping the first polycrystalline Silicon layer over the first, second, and third non-passivation regions, and the second patterned photo layer removed from the first SOI wafer illustrated in FIG. 22.

FIG. 23 shows the doped first polycrystalline Silicon layer 36 formed by doping the first polycrystalline Silicon layer 32 over the first, second, and third non-passivation regions 16, 20, 22, and the second patterned photo layer 34 removed from the first SOI wafer 82 illustrated in FIG. 22. The doped first polycrystalline Silicon layer 36 may include N-type material, P-type material, or both. Other embodiments of the present invention may use other techniques to dope the first polycrystalline Silicon layer 32 over only the first, second, and third non-passivation regions 16, 20, 22. A cross-section 38 of the first SOI wafer 82 may be used in subsequent figures to further illustrate the invention.

Figure 24:
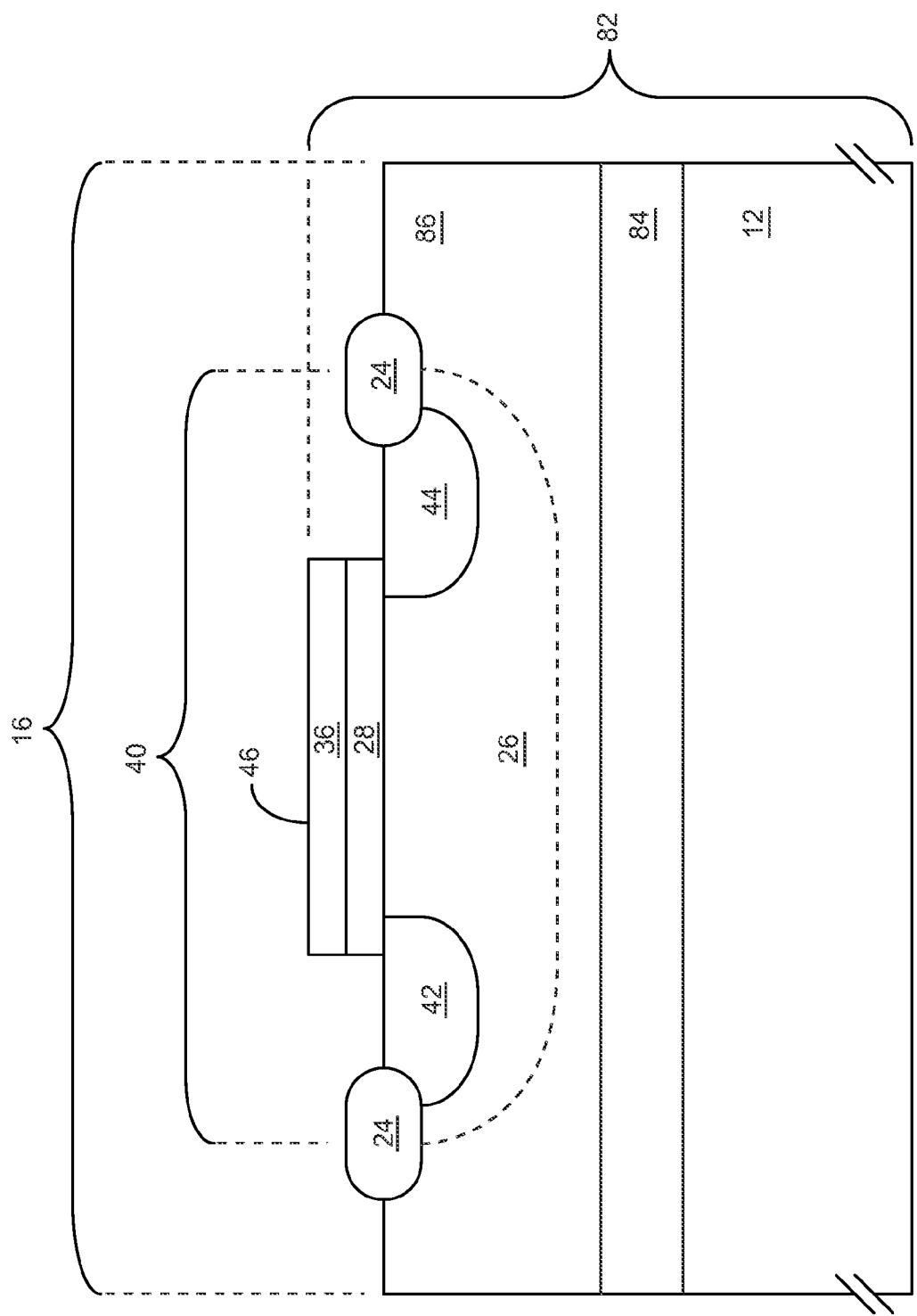
FIG. 24 shows a cross-section of the MOS transistor element formed over the first non-passivation region of the first SOI wafer illustrated in FIG. 23.

FIG. 24 shows a cross-section 38 of the MOS transistor element 40 formed over the first non-passivation region 16 of the first SOI wafer 82 illustrated in FIG. 23. The MOS transistor element 40 is one example of an active device. Standard CMOS process techniques may be used to form the MOS transistor element 40. The well 26 is formed by doping the SOI device layer 86 and may be surrounded by the isolation oxide 24, which may separate the MOS transistor element 40 from other devices. The source 42 and the drain 44 are formed by doping the SOI device layer 86. The channel (not shown) is between the source 42 and the drain 44 in the SOI device layer 86. The channel provides a controllable conduction path between the source 42 and the drain 44. The gate oxide layer 28 and the doped first polycrystalline Silicon layer 36 provide the gate 46, which is located substantially over the channel. The gate oxide layer 28 and the doped first polycrystalline Silicon layer 36 may be removed from the rest of the MOS transistor element 40. A voltage between the gate 46 and the source 42 may control current through the channel. In an NMOS transistor element 40, the well 26 is a P-well and the source 42 and the drain 44 include N-type material. In a PMOS transistor element 40, the well 26 is an N-well and the source 42 and the drain 44 include P-type material.

Figure 25:
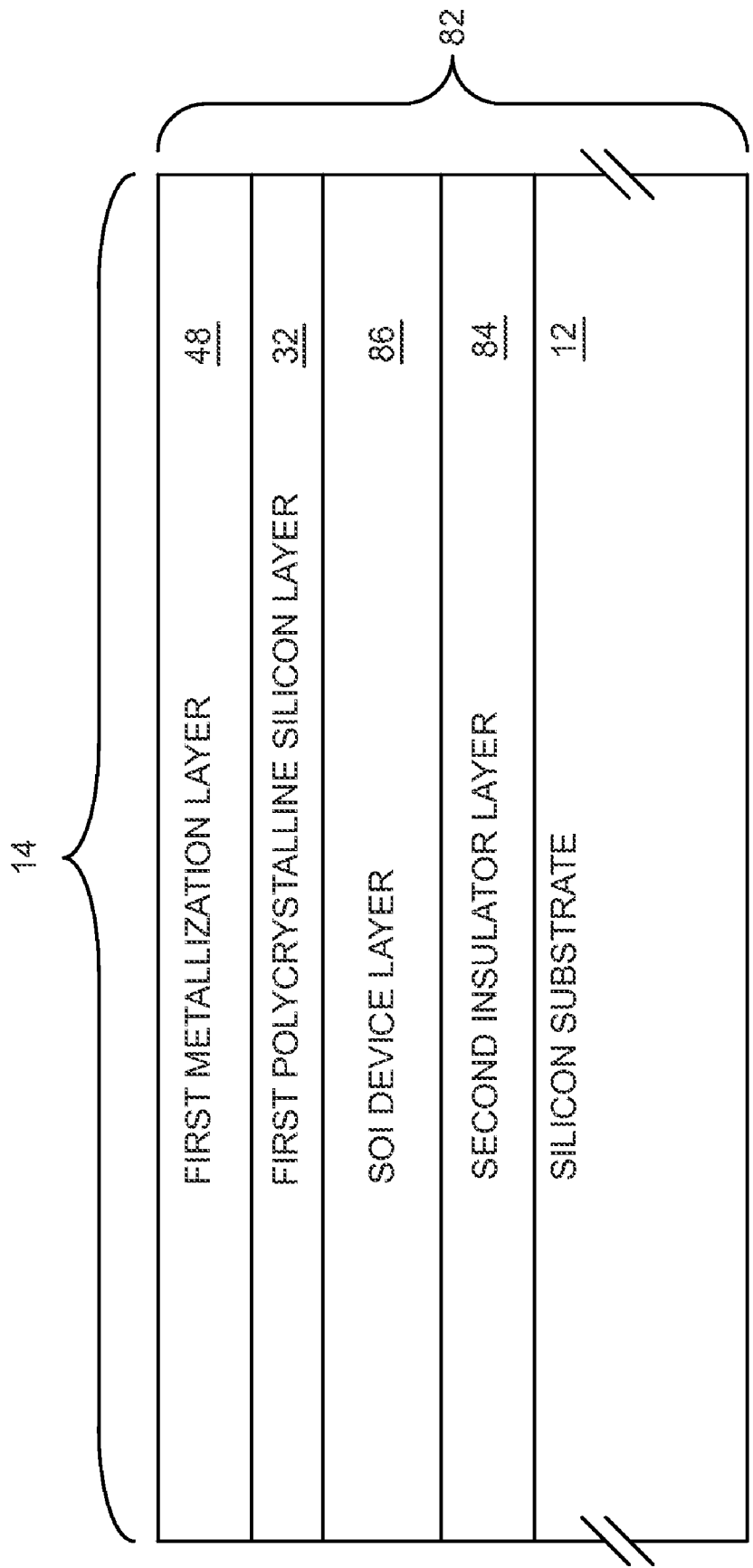
FIG. 25 shows a cross-section of the first passivation region of the first SOI wafer illustrated in FIG. 23.

FIG. 25 shows a cross-section 38 of the first passivation region 14 of the first SOI wafer 82 illustrated in FIG. 23. The first SOI wafer 82 includes the Silicon substrate 12. The second insulator layer 84 is formed over the Silicon substrate 12 and the SOI device layer 86 is formed over the second insulator layer 84. The first polycrystalline Silicon layer 32 is formed over the SOI device layer 86. A layer using a different potentially trap-rich material may be used instead of the first polycrystalline Silicon layer 32, according to alternate embodiments of the present invention. In one embodiment of the present invention, an amorphous Silicon film is used instead of the first polycrystalline Silicon layer 32. The amorphous Silicon film may be formed by modifying a top layer of the SOI device layer 86 to induce a large number of traps. Ions may be implanted to disrupt the Silicon lattice of the SOI device layer 86 to make it amorphous. The first metallization layer 48 is formed over the first polycrystalline Silicon layer 32. The first polycrystalline Silicon layer 32 may have a high density of traps, which may be used to trap carriers from the SOI device layer 86, the first polycrystalline Silicon layer 32, or both. Trapping carriers may substantially immobilize a surface conduction layer (not shown) in the SOI device layer 86. The SOI device layer 86 may or may not be doped. The SOI device layer 86 may be doped to form N-type material, P-type material, or both. The first polycrystalline Silicon layer 32 may or may not be doped. The first polycrystalline Silicon layer 32 may be doped to form N-type material, P-type material, or both. However, over the first and second passivation regions 14, 18, the first polycrystalline Silicon layer 32 and the SOI device layer 86 would normally not be doped or would be doped very lightly. The first polycrystalline Silicon layer 32 may passivate the surface of the SOI device layer 86. A carrier concentration in the first polycrystalline Silicon layer 32 may be less than a concentration of traps in the first polycrystalline Silicon layer 32. A thickness of the first polycrystalline Silicon layer 32 may be greater than about 100 nanometers. An average release time of a carrier in a trap in the first polycrystalline Silicon layer 32 may be greater than about 100 microseconds. In an exemplary embodiment of the present invention, the average release time of a carrier in a trap in the first polycrystalline Silicon layer 32 is greater than about one millisecond.

The first polycrystalline Silicon layer 32 may be in electrical contact with the SOI device layer 86. The SOI device layer 86 may have a thin oxide layer (not shown), which may have a thickness of less than about 20 angstroms and may be formed natively by exposure to air, or may be formed when the first polycrystalline Silicon layer 32 is formed over the SOI device layer 86. The thin oxide layer may be formed based on the process technique used to add the first polycrystalline Silicon layer 32, such as LPCVD. However, the thin oxide layer does not interfere with carrier transfer between the first polycrystalline Silicon layer 32 and the SOI device layer 86, such that carriers transfer freely between the first polycrystalline Silicon layer 32 and the SOI device layer 86. The SOI device layer 86 may have a majority carrier relaxation time, which may be about equal to a resistivity of the SOI device layer 86 times a dielectric permittivity of the SOI device layer 86. In an exemplary embodiment of the present invention, the thickness of the first polycrystalline Silicon layer 32 may be equal to about 300 nanometers. The resistivity of the SOI device layer 86 may be greater than about 1000 ohm·centimeters. The dielectric permittivity of the SOI device layer 86 may be equal to about one picofarad per centimeter. The majority carrier relaxation time of the SOI device layer 86 may be equal to about one nanosecond. Alternate embodiments of the present invention may include one or more intervening layers between the SOI device layer 86 and the first polycrystalline Silicon layer 32, between the first polycrystalline Silicon layer 32 and the first metallization layer 48, or both. The first SOI wafer 82 may include the RF inductive element 50 (not shown), the RF coupler 56 (not shown), the MEMS RF switch 66 (not shown), the RF transmission line 72 (not shown), other passive devices, or any combination thereof. However, any intervening layers between the Silicon substrate 12 and the first polycrystalline Silicon layer 32 must not interfere with carrier transfer between the first polycrystalline Silicon layer 32 and the Silicon substrate 12.

Figure 26:
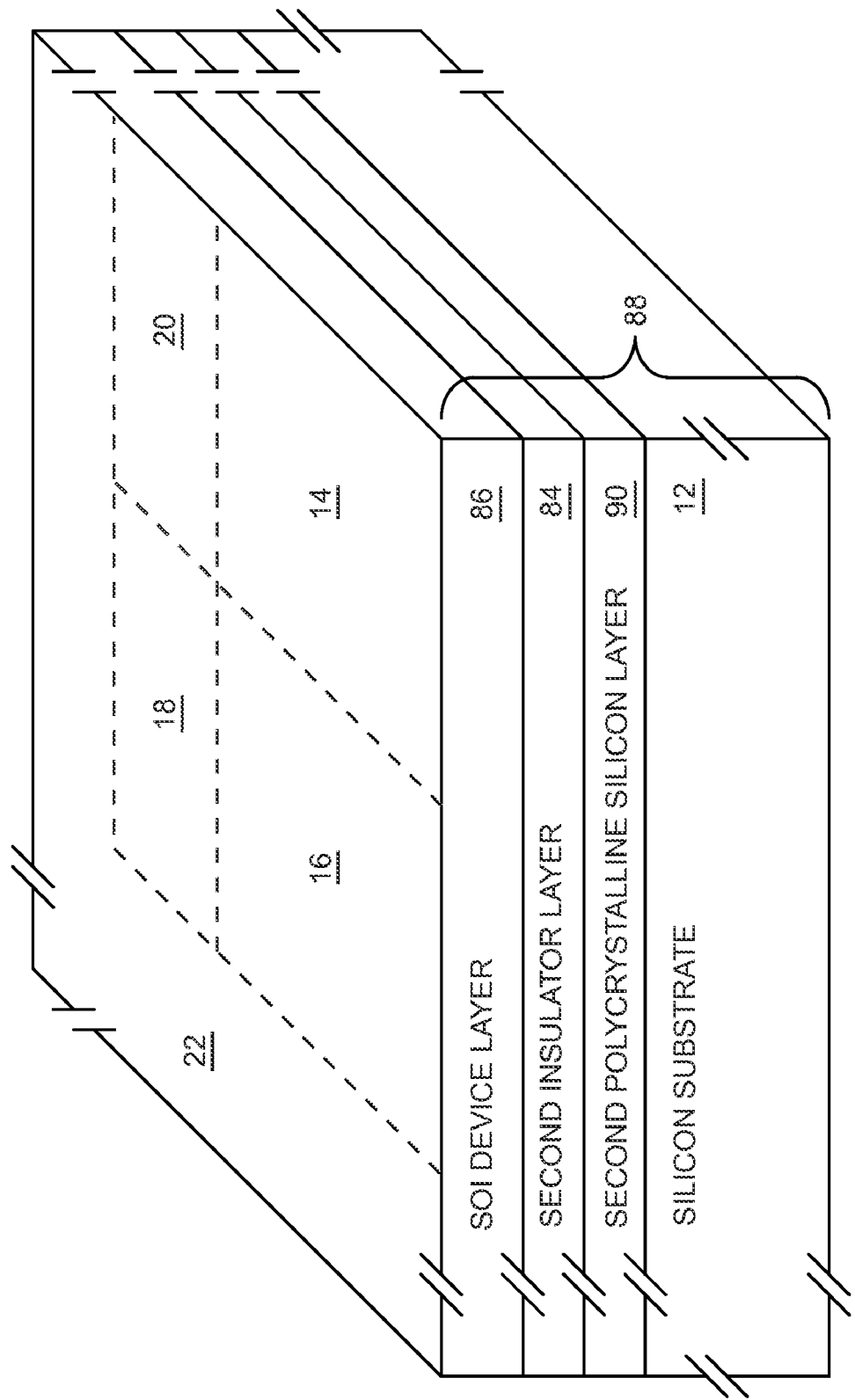
FIG. 26 shows a three-dimensional view of a second SOI wafer, according to another embodiment of the present invention.

FIG. 26 shows a three-dimensional view of a second SOI wafer 88, according to another embodiment of the present invention. The second SOI wafer 88 includes the Silicon substrate 12. A second polycrystalline Silicon layer 90 is formed over and may passivate the Silicon substrate 12. The second insulator layer 84 is formed over the second polycrystalline Silicon layer 90, and the SOI device layer 86 is formed over the second insulator layer 84. The SOI device layer 86 has the first passivation region 14, the first non-passivation region 16, the second passivation region 18, the second non-passivation region 20, and the third non-passivation region 22. One or more active devices may be formed over the first, second, and third non-passivation regions 16, 20, 22, and one or more passive devices may be formed over the first and second passivation regions 14, 18. Other embodiments of the present invention may have any number of passivation regions providing any number of passive devices, active devices, or both, and any number of non-passivation regions providing any number of passive devices, active devices, or both. Other embodiments of the present invention may use another semiconductor substrate in place of the Silicon substrate 12, such as Gallium Arsenide.

Figure 27:
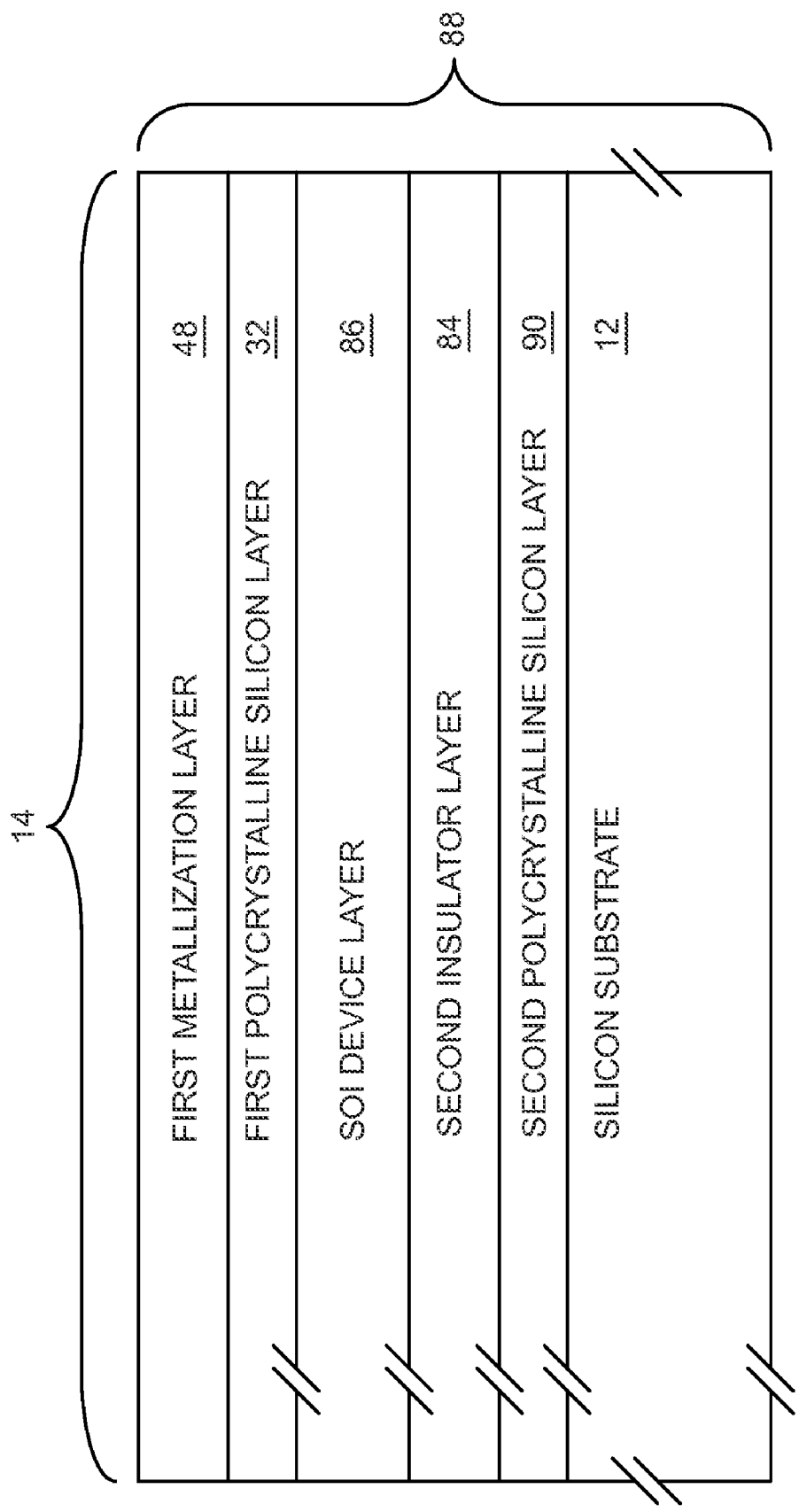
FIG. 27 shows a cross-section of the first passivation region of the second SOI wafer illustrated in FIG. 26.

FIG. 27 shows a cross-section 38 of the first passivation region 14 of the second SOI wafer 88 illustrated in FIG. 25. The second SOI wafer 88 includes the Silicon substrate 12. The second polycrystalline Silicon layer 90 is formed over the Silicon substrate 12, the second insulator layer 84 is formed over the second polycrystalline Silicon layer 90, and the SOI device layer 86 is formed over the second insulator layer 84. The first polycrystalline Silicon layer 32 is formed over the SOI device layer 86. Layers using different potentially trap-rich materials may be used instead of the first polycrystalline Silicon layer 32, the second polycrystalline Silicon layer 90, or both, according to alternate embodiments of the present invention. In one embodiment of the present invention, an amorphous Silicon film is used instead of the first polycrystalline Silicon layer 32, the second polycrystalline Silicon layer 90, or both. The amorphous Silicon film may be formed by modifying a top layer of the Silicon substrate 12, the SOI device layer 86, or both to induce a large number of traps. Ions may be implanted to disrupt the Silicon lattice of the Silicon substrate 12, the SOI device layer 86, or both to make them amorphous. The first metallization layer 48 is formed over the first polycrystalline Silicon layer 32. The first polycrystalline Silicon layer 32 may have a high density of traps, which may be used to trap carriers from the SOI device layer 86, the first polycrystalline Silicon layer 32, or both. Trapping carriers may substantially immobilize a surface conduction layer (not shown) in the SOI device layer 86. The SOI device layer 86 may or may not be doped. The SOI device layer 86 may be doped to form N-type material, P-type material, or both. The first polycrystalline Silicon layer 32 may or may not be doped. The first polycrystalline Silicon layer 32 may be doped to form N-type material, P-type material, or both. However, over the first and second passivation regions 14, 18, the first polycrystalline Silicon layer 32 and the SOI device layer 86 would normally not be doped or would be doped very lightly. The first polycrystalline Silicon layer 32 may passivate the surface of the SOI device layer 86. A carrier concentration in the first polycrystalline Silicon layer 32 may be less than a concentration of traps in the first polycrystalline Silicon layer 32. A thickness of the first polycrystalline Silicon layer 32 may be greater than about 100 nanometers. An average release time of a carrier in a trap in the first polycrystalline Silicon layer 32 may be greater than about 100 microseconds. In an exemplary embodiment of the present invention, the average release time of a carrier in a trap in the first polycrystalline Silicon layer 32 is greater than about one millisecond.

The first polycrystalline Silicon layer 32 may be in electrical contact with the SOI device layer 86. The SOI device layer 86 may have a thin oxide layer (not shown), which may have a thickness of less than about 20 angstroms and may be formed natively by exposure to air, or may be formed when the first polycrystalline Silicon layer 32 is formed over the SOI device layer 86. The thin oxide layer may be formed based on the process technique used to add the first polycrystalline Silicon layer 32, such as LPCVD. However, the thin oxide layer does not interfere with carrier transfer between the first polycrystalline Silicon layer 32 and the SOI device layer 86, such that carriers transfer freely between the first polycrystalline Silicon layer 32 and the SOI device layer 86. The first polycrystalline Silicon layer 32 may be in electrical contact with the SOI device layer 86. The SOI device layer 86 may have a thin oxide layer (not shown), which may have a thickness of less than about 20 angstroms and may be interrupted by the first polycrystalline Silicon layer 32 formed over the SOI device layer 86. The SOI device layer 86 may have a majority carrier relaxation time, which may be about equal to a resistivity of the SOI device layer 86 times a dielectric permittivity of the SOI device layer 86. In an exemplary embodiment of the present invention, the thickness of the first polycrystalline Silicon layer 32 may be equal to about 300 nanometers. The resistivity of the SOI device layer 86 may be greater than about 1000 ohm·centimeters. The dielectric permittivity of the SOI device layer 86 may be equal to about one picofarad per centimeter. The majority carrier relaxation time of the SOI device layer 86 may be equal to about one nanosecond. Alternate embodiments of the present invention may include one or more intervening layers between the SOI device layer 86 and the first polycrystalline Silicon layer 32, between the first polycrystalline Silicon layer 32 and the first metallization layer 48, or both. However, any intervening layers between the SOI device layer 86 and the first polycrystalline Silicon layer 32 must not interfere with carrier transfer between the first polycrystalline Silicon layer 32 and the SOI device layer 86.

The second polycrystalline Silicon layer 90 may have a high density of traps, which may be used to trap carriers from the Silicon substrate 12, the second polycrystalline Silicon layer 90, or both. Trapping carriers may substantially immobilize a surface conduction layer (not shown) in the Silicon substrate 12. The Silicon substrate 12 may or may not be doped. The Silicon substrate 12 may be doped to form N-type material, P-type material, or both. The second polycrystalline Silicon layer 90 may or may not be doped. The second polycrystalline Silicon layer 90 may be doped to form N-type material, P-type material, or both. However, over the first and second passivation regions 14, 18, the second polycrystalline Silicon layer 90 and the Silicon substrate 12 would normally not be doped or would be doped very lightly. The second polycrystalline Silicon layer 90 may passivate the surface of the Silicon substrate 12. A carrier concentration in the second polycrystalline Silicon layer 90 may be less than a concentration of traps in the second polycrystalline Silicon layer 90. A thickness of the second polycrystalline Silicon layer 90 may be greater than about 100 nanometers. An average release time of a carrier in a trap in the second polycrystalline Silicon layer 90 may be greater than about 100 microseconds. In an exemplary embodiment of the present invention, the average release time of a carrier in a trap in the second polycrystalline Silicon layer 90 is greater than about one millisecond.

The second polycrystalline Silicon layer 90 may be in electrical contact with the Silicon substrate 12. The Silicon substrate 12 may have a thin oxide layer (not shown), which may have a thickness of less than about 20 angstroms and may be formed natively by exposure to air, or may be formed when the second polycrystalline Silicon layer 90 is formed over the Silicon substrate 12. The thin oxide layer may be formed based on the process technique used to add the second polycrystalline Silicon layer 90, such as LPCVD. However, the thin oxide layer does not interfere with carrier transfer between the second polycrystalline Silicon layer 90 and the Silicon substrate 12, such that carriers transfer freely between the second polycrystalline Silicon layer 90 and the Silicon substrate 12. The Silicon substrate 12 may have a majority carrier relaxation time, which may be about equal to a resistivity of the Silicon substrate 12 times a dielectric permittivity of the Silicon substrate 12. In an exemplary embodiment of the present invention, the thickness of the second polycrystalline Silicon layer 90 may be equal to about 300 nanometers. The resistivity of the Silicon substrate 12 may greater than about 1000 ohm·centimeters. The dielectric permittivity of the Silicon substrate 12 may be equal to about one picofarad per centimeter. The majority carrier relaxation time of the Silicon substrate 12 may be equal to about one nanosecond. Alternate embodiments of the present invention may include one or more intervening layers between the Silicon substrate 12 and the second polycrystalline Silicon layer 90, between the second polycrystalline Silicon layer 90 and the second insulator layer 84, or both. However, any intervening layers between the Silicon substrate 12 and the second polycrystalline Silicon layer 90 must not interfere with carrier transfer between the second polycrystalline Silicon layer 90 and the Silicon substrate 12. The second SOI wafer 88 may include the RF inductive element 50 (not shown), the RF coupler 56 (not shown), the MEMS RF switch 66 (not shown), the RF transmission line 72 (not shown), other passive devices, or any combination thereof.

Figure 28:
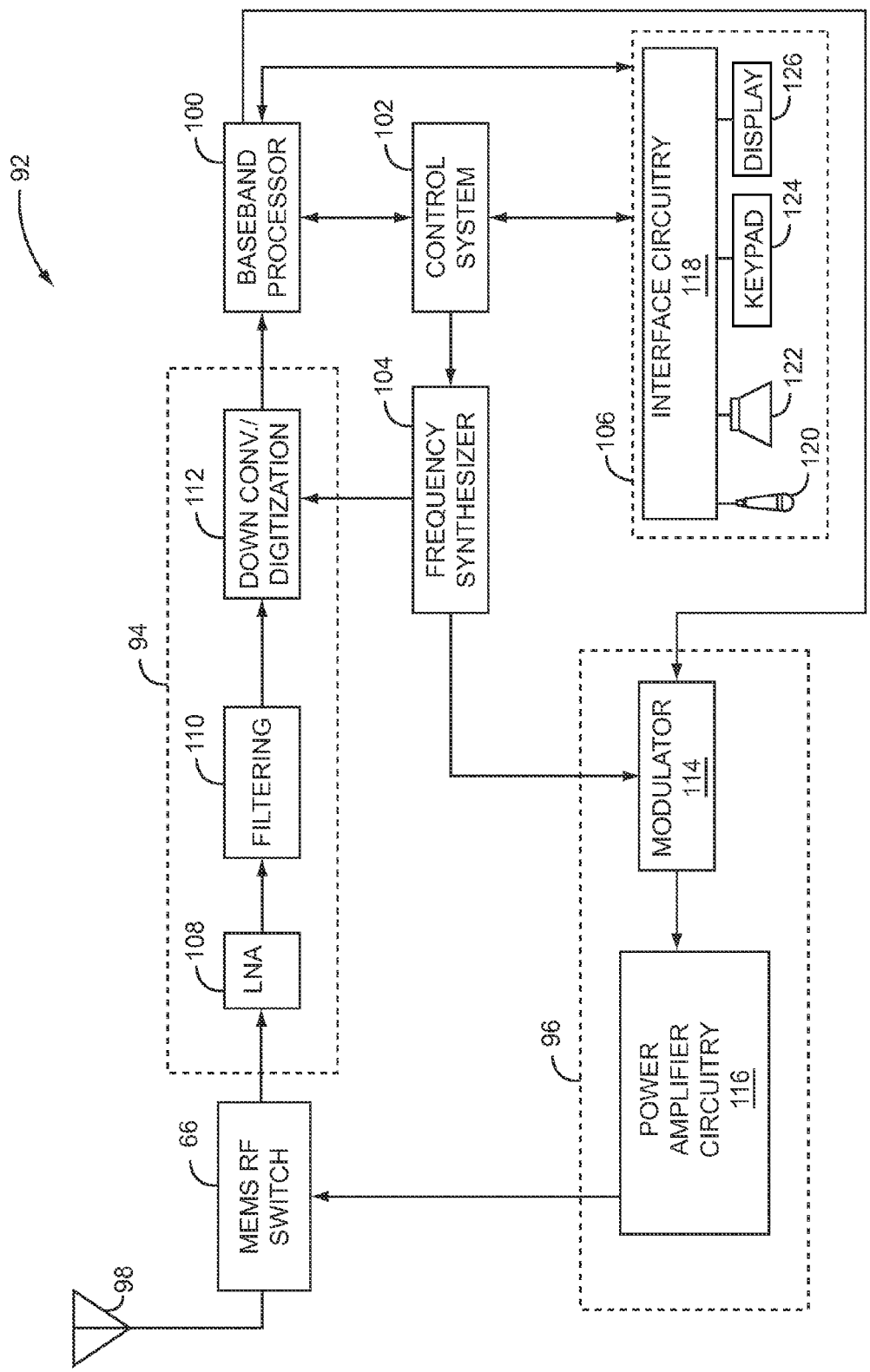
FIG. 28 shows an application example of the present invention used in a mobile terminal.

An application example of the present invention is the MOS transistor element 40 used in interface circuitry to drive the MEMS RF switch 66, which is used to switch RF signals in a mobile terminal 92, the basic architecture of which is represented in FIG. 28. The mobile terminal 92 may include a receiver front end 94, a radio frequency transmitter section 96, an antenna 98, the MEMS RF switch 66, a baseband processor 100, a control system 102, a frequency synthesizer 104, and an interface 106. The receiver front end 94 receives information bearing radio frequency signals from one or more remote transmitters provided by a base station (not shown). A low noise amplifier (LNA) 108 amplifies the signal. A filter circuit 110 minimizes broadband interference in the received signal, while down conversion and digitization circuitry 112 down converts the filtered, received signal to an intermediate or baseband frequency signal, which is then digitized into one or more digital streams. The receiver front end 94 typically uses one or more mixing frequencies generated by the frequency synthesizer 104. The baseband processor 100 processes the digitized received signal to extract the information or data bits conveyed in the received signal. This processing typically comprises demodulation, decoding, and error correction operations. As such, the baseband processor 100 is generally implemented in one or more digital signal processors (DSPs).

On the transmit side, the baseband processor 100 receives digitized data, which may represent voice, data, or control information, from the control system 102, which it encodes for transmission. The encoded data is output to the transmitter 96, where it is used by a modulator 114 to modulate a carrier signal that is at a desired transmit frequency. Power amplifier circuitry 116 amplifies the modulated carrier signal to a level appropriate for transmission, and delivers the amplified and modulated carrier signal to the antenna 98 through the MEMS RF switch 66.

A user may interact with the mobile terminal 92 via the interface 106, which may include interface circuitry 118 associated with a microphone 120, a speaker 122, a keypad 124, and a display 126. The interface circuitry 118 typically includes analog-to-digital converters, digital-to-analog converters, amplifiers, and the like. Additionally, it may include a voice encoder/decoder, in which case it may communicate directly with the baseband processor 100. The microphone 120 will typically convert audio input, such as the user's voice, into an electrical signal, which is then digitized and passed directly or indirectly to the baseband processor 100. Audio information encoded in the received signal is recovered by the baseband processor 100, and converted by the interface circuitry 118 into an analog signal suitable for driving the speaker 122. The keypad 124 and display 126 enable the user to interact with the mobile terminal 92, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A semiconductor wafer comprising:
   a Silicon semiconductor substrate having at least one passivation region and at least one non-passivation region;
   a first insulator layer formed over the at least one non-passivation region;
   a polycrystalline Silicon layer:
      formed over the at least one passivation region to passivate the semiconductor substrate to trap carriers from the semiconductor substrate, thereby substantially immobilizing a surface conduction layer in the semiconductor substrate; and
      formed over the first insulator layer, such that over the at least one non-passivation region, the polycrystalline Silicon layer is doped to form a doped polycrystalline Silicon layer;
   at least one active device formed in the at least one non-passivation region; and
   at least one passive device formed over the at least one passivation region,
   wherein over the at least one passivation region, the polycrystalline Silicon layer is not doped.

2. The semiconductor wafer of claim 1 wherein the polycrystalline Silicon layer is formed using standard complementary metal oxide semiconductor (CMOS) process techniques.

3. The semiconductor wafer of claim 1 further comprising a metallization layer, wherein the at least one passive device:
   comprises at least one of a radio frequency (RF) microelectromechanical systems (MEMS) switch, an RF inductive element, and an RF coupler; and
   is formed using the polycrystalline Silicon layer and the metallization layer.

4. The semiconductor wafer of claim 1 further comprising a metallization layer, wherein the at least one passive device:
   comprises at least one radio frequency (RF) transmission line; and
   is formed using the polycrystalline Silicon layer and the metallization layer.

5. The semiconductor wafer of claim 1 wherein carriers transfer freely between the polycrystalline Silicon layer and the Silicon substrate.

6. The semiconductor wafer of claim 1 further comprising:
   a second insulator layer formed over the at least one passivation region over the polycrystalline Silicon layer; and
   a metallization layer formed over the second insulator layer, wherein the at least one passive device is formed using the second insulator layer and the metallization layer.

7. A semiconductor wafer comprising:
   a Silicon semiconductor substrate having at least one passivation region and at least one non-passivation region;
   a first insulator layer formed over the at least one non-passivation region;
   a polycrystalline Silicon layer:
      formed over the at least one passivation region to passivate the semiconductor substrate to trap carriers from the semiconductor substrate, thereby substantially immobilizing a surface conduction layer in the semiconductor substrate; and formed over the first insulator layer, such that over the at least one non-passivation region, the polycrystalline Silicon layer is doped to form a doped polycrystalline Silicon layer;

at least one active device formed in the at least one non-passivation region;

at least one passive device formed over the at least one passivation region;

a drain formed using the Silicon substrate;

a source formed using the Silicon substrate;

a well formed using the Silicon substrate; and a gate formed using the doped polycrystalline Silicon layer, wherein the first insulator layer is a gate oxide layer and the at least one active device comprises a metal oxide semiconductor (MOS) transistor element having the drain, the source, the well, and the gate.

8. A method comprising:

providing a Silicon semiconductor substrate having at least one passivation region and at least one non-passivation region;

forming a first insulator layer over the at least one non-passivation region;

forming a polycrystalline Silicon layer:
over the at least one passivation region to passivate the semiconductor substrate to trap carriers from the semiconductor substrate, thereby substantially immobilizing a surface conduction layer in the semiconductor substrate; and
over the first insulator layer, such that over the at least one non-passivation region, the polycrystalline Silicon layer is doped to form a doped polycrystalline Silicon layer;

forming at least one active device in the at least one non-passivation region; and forming at least one passive device over the at least one passivation region, wherein over the at least one passivation region, the polycrystalline Silicon layer is not doped.

9. The method of claim 8 further comprising:

forming the first insulator layer over the at least one passivation region; and removing the first insulator layer from over the at least one passivation region, wherein after the removing, over the at least one non-passivation region, the polycrystalline Silicon layer is over the first insulator layer.

10. A Silicon-on-insulator (SOI) wafer comprising:

a Silicon semiconductor substrate;

a first insulator layer over the semiconductor substrate;

an SOI device layer over the first insulator layer and having at least one passivation region and at least one non-passivation region;

a second insulator layer formed over the at least one non-passivation region;

a polycrystalline Silicon layer:
formed over the at least one passivation region to passivate the SOI device layer to trap carriers from the SOI device layer, thereby substantially immobilizing a surface conduction layer in the SOI device layer; and
formed over the second insulator layer, such that over the at least one non-passivation region, the polycrystalline Silicon layer is doped to form a doped polycrystalline Silicon layer;

at least one active device formed in the at least one non-passivation region; and at least one passive device formed over the at least one passivation region, wherein over the at least one passivation region, the polycrystalline Silicon layer is not doped.

11. The SOI wafer of claim 10 further comprising a second layer formed over the semiconductor substrate to passivate the semiconductor substrate to trap carriers from the semiconductor substrate, thereby substantially immobilizing a surface conduction layer in the semiconductor substrate, wherein the first insulator layer is over the second layer.

12. The SOI wafer of claim 10 wherein the polycrystalline Silicon layer is formed using standard complementary metal oxide semiconductor (CMOS) process techniques.

13. The SOI wafer of claim 10 further comprising a metallization layer, wherein the at least one passive device:
comprises at least one of a radio frequency (RF) microelectromechanical systems (MEMS) switch, an RF inductive element, and an RF coupler; and
is formed using the polycrystalline Silicon layer and the metallization layer.

14. The SOI wafer of claim 10 further comprising a metallization layer, wherein the at least one passive device:
comprises at least one radio frequency (RF) transmission line; and
is formed using the polycrystalline Silicon layer and the metallization layer.

15. The SOI wafer of claim 10 wherein over the at least one passivation region, the polycrystalline Silicon layer is in electrical contact with the SOI device layer.

16. A Silicon-on-insulator (SOI) wafer comprising:

a Silicon semiconductor substrate;

a first insulator layer over the semiconductor substrate;

an SOI device layer over the first insulator layer and having at least one passivation region and at least one non-passivation region;

a second insulator layer formed over the at least one non-passivation region;

a polycrystalline Silicon layer:
formed over the at least one passivation region to passivate the SOI device layer to trap carriers from the SOI device layer, thereby substantially immobilizing a surface conduction layer in the SOI device layer; and
formed over the second insulator layer, such that over the at least one non-passivation region, the polycrystalline Silicon layer is doped to form a doped polycrystalline Silicon layer;

at least one active device formed in the at least one non-passivation region; and at least one passive device formed over the at least one passivation region;

a drain formed using the SOI device layer;

a source formed using the SOI device layer; and a gate formed using the doped polycrystalline Silicon layer, wherein the second insulator layer is a gate oxide layer and the at least one active device comprises a metal oxide semiconductor (MOS) transistor element having the drain, the source, and the gate.

17. A method comprising:

providing a Silicon-on-insulator (SOI) wafer comprising:
a Silicon semiconductor substrate;
a first insulator layer over the semiconductor substrate; and an SOI device layer over the first insulator layer and having at least one passivation region and at least one non-passivation region;

forming a second insulator layer over the at least one non-passivation region;

forming a polycrystalline Silicon layer:

over the at least one passivation region to passivate the SOI device layer to trap carriers from the SOI device layer, thereby substantially immobilizing a surface conduction layer in the SOI device layer; and over the second insulator layer, such that over the at least one non-passivation region, the polycrystalline Silicon layer is doped to form a doped polycrystalline Silicon layer;

forming at least one active device in the at least one non-passivation region; and forming at least one passive device over the at least one passivation region, wherein over the at least one passivation region, the polycrystalline Silicon layer is not doped.

18. The method of claim 17 further comprising:

forming the second insulator layer over the at least one passivation region; and removing the second insulator layer from over the at least one passivation region, wherein after the removing, over the at least one non-passivation region, the polycrystalline Silicon layer is over the second insulator layer.

* * * * *